(12) United States Patent
Goker et al.

(10) Patent No.: US 11,216,196 B2
(45) Date of Patent: Jan. 4, 2022

(54) ERASURE CODING MAGNETIC TAPES FOR MINIMUM LATENCY AND ADAPTIVE PARITY PROTECTION FEEDBACK

(71) Applicant: Quantum Corporation, San Jose, CA (US)

(72) Inventors: Turguy Goker, Irvine, CA (US); Suayb Arslan, Irvine, CA (US); Hoa Le, San Jose, CA (US); James Peng, San Jose, CA (US); Carsten Prigge, San Jose, CA (US)

(73) Assignee: Quantum Corporation, San Jose, CA (US)

(*) Notice: Subject to any disclaimer, the term of this patent is extended or adjusted under 35 U.S.C. 154(b) by 270 days.

(21) Appl. No.: 16/421,685

(22) Filed: May 24, 2019

(65) Prior Publication Data

US 2019/0361606 A1 Nov. 28, 2019

Related U.S. Application Data

(60) Provisional application No. 62/675,979, filed on May 24, 2018, provisional application No. 62/808,452, filed on Feb. 21, 2019.

(51) Int. Cl.
*G06F 11/00* (2006.01)
*G06F 3/06* (2006.01)
(Continued)

(52) U.S. Cl.
CPC .......... *G06F 3/064* (2013.01); *G06F 3/0611* (2013.01); *G06F 3/0619* (2013.01);
(Continued)

(58) Field of Classification Search
CPC .... G06F 3/064; G06F 11/085; G06F 11/1044; G06F 11/108; G06F 11/1048;
(Continued)

(56) References Cited

U.S. PATENT DOCUMENTS 8,615,689 B2 * 12/2013 Kabelac ................. G11B 27/36
714/711
9,431,054 B1 * 8/2016 Goker ................. G06F 11/1076
(Continued)

*Primary Examiner* — Albert Decady
*Assistant Examiner* — Osman M Alshack
(74) *Attorney, Agent, or Firm* — Eschweiler & Potashnik, LLC

(57) ABSTRACT

A magnetic tape device or system can store erasure encoded data that generates a multi-dimensional erasure code corresponding to an erasure encoded object comprising a codeword (CW). The multi-dimensional erasure code enables using a single magnetic tape in response to a random object/file request, and correct for an error within the single magnetic tape without using other tapes. Encoding logic can further utilize other magnetic tapes to generate additional parity tapes that recover data from an error of the single magnetic tape in response to the error satisfying a threshold severity for a reconstruction of the erasure coded object or chunk(s) of the CW. The encoding logic can be controlled, at least in part, by one or more iterative coding processes between multiple erasure code dimensions that are orthogonal to one another.

24 Claims, 27 Drawing Sheets

(51) Int. Cl.
   *G11B 27/032* (2006.01)
   *G06F 11/16* (2006.01)
   *G06F 11/10* (2006.01)
   *G06F 11/08* (2006.01)

(52) U.S. Cl.
   CPC .......... *G06F 3/0644* (2013.01); *G06F 3/0652* (2013.01); *G06F 3/0686* (2013.01); *G06F 11/085* (2013.01); *G06F 11/108* (2013.01); *G06F 11/1044* (2013.01); *G06F 11/1048* (2013.01); *G06F 11/1612* (2013.01); *G11B 27/032* (2013.01); *G06F 3/0682* (2013.01)

(58) Field of Classification Search
   CPC .... G06F 3/0619; G06F 3/0611; G06F 3/0644; G06F 3/0686; G06F 11/1612; G06F 3/0652; G06F 2003/0698; G06F 11/2097; G06F 11/2094; H03M 13/2918; H03M 13/2909; H03M 13/373; H03M 13/1515; G11B 27/032; G11B 20/1833; G11B 27/107
   USPC .................................. 714/800–805
   See application file for complete search history.

(56) References Cited

U.S. PATENT DOCUMENTS

| | | | | |
|---|---|---|---|---|
| 9,564,925 | B1* | 2/2017 | Bentley | H03M 13/15 |
| 2003/0115537 | A1* | 6/2003 | Boyer | G11B 20/1833 |
| | | | | 714/769 |
| 2007/0014042 | A1* | 1/2007 | Nylander-Hill | G11B 27/36 |
| | | | | 360/31 |
| 2009/0207515 | A1* | 8/2009 | Cideciyan | G11B 20/1201 |
| | | | | 360/31 |
| 2009/0287982 | A1* | 11/2009 | Kabelac | G11B 27/36 |
| | | | | 714/771 |
| 2014/0189461 | A1* | 7/2014 | Cideciyan | G11B 7/007 |
| | | | | 714/758 |
| 2014/0355151 | A1* | 12/2014 | Cideciyan | G11B 5/55 |
| | | | | 360/48 |
| 2015/0046767 | A1* | 2/2015 | Cideciyan | H03M 13/293 |
| | | | | 714/755 |
| 2015/0098149 | A1* | 4/2015 | Bates | G11B 27/3027 |
| | | | | 360/72.1 |
| 2016/0329914 | A1* | 11/2016 | Cideciyan | H03M 13/616 |

* cited by examiner

Step # 2 correct all single & dual row errors & all tapes are recovered

700

| Tape | 1 | 2 | 3 | 4 | 5 | 6 | 7 |
|---|---|---|---|---|---|---|---|
| Row 1 | X1a | X1b | X1c | X1d | X1e | H11 | H21 |
| 2 | X2a | X2b | X2c | X2d | X2e | H12 | H22 |
| 12 | X12a | X12b | X12c | X12d | X12e | H112 | H212 |
| 13 | P1a | P1b | P1c | P1d | P1e | P1h1 | P1h2 |
| 14 | P2a | P2b | P2c | P2d | P2e | P2h1 | P2h2 |

FIG. 7

Format (n+m)/m local code and 7/2 global code example

|  | #1 | #2 | #3 | #4 | #5 | #6 | #7 | Row #1 |
|--|----|----|----|----|----|----|----|--------|
|  | X1a | X2 | X3 | X4 | X5 | H1 | H2 | |
|  | X2a | X2 | X3 | X4 | X5 | H1 | H2 | |
|  | | Files each on one tape | | | | Global Parity | | |
|  | Xna | X2 | X3 | X4 | X5 | H1 | H2 | |
|  | P1 | P1 | P1 | P1 | P1 | P1 | P1 | |
|  | Local Parity | | | | | | | |
|  | Pm | Pm | Pm | Pm | Pm | Pm | Pm | |

Column #1

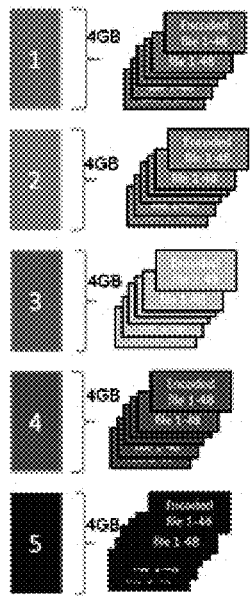

Example to recover data from Hard Read Error with 10% ECC overhead

Grouping, Interleaving 5 x 4GB files = 20GB
Using policy 48x4 (9% over head) to encode 5 x 4GB files. Encoder generates 44 data chunks and 4 parity chunks for each 4GB file. Chunk files from each 4GB file will be interleaved to generate 48 groups (44 data's and 4 parity's groups). Each group has 5 chunk files as follows:
Group #1: 1-k1, 2-k1, 3-k1, 4-k1, 5-k1
Group #2: 1-k2, 2-k2, 3-k2, 4-k2, 5-k2
Group #44: 1-k44, 2-k44, 3-k44, 4-k44, 5-k44
Group #45: 1-m1, 2-m1, 3-m1, 4-m1, 5-m1
Group #48: 1-m4, 2-m4, 3-m4, 4-m4, 5-m4

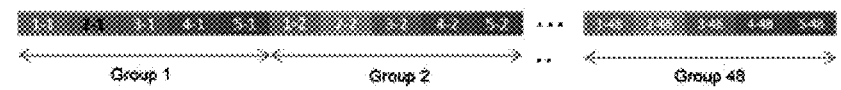

Group 1    Group 2    Group 48

Test set up and results:
Record size: 512KB
Chunk file size: 92798976 bytes = 177 records ~= 1615mm
Group 5 chunks size: 885 records ~= 8075mm
Hard read error at LBA 22300, group 26* (by manually damaged the media)
Resume to read at LBA 25500, group 30*
Data lost: 4 groups = 4 files per group = 20 files = 20 files / 240 files = 8.33%
Interleaving method, we are able to recover data from Hard Error with 10% ECC Overhead

Single Partition ECTape

Tape layout

Write From BOT
- FID: LTO Format ID, written by drive FW
- Write ECTape ID (ECTape Identification)
- Write FileMark Immediate (streaming write)
- Write Encoded Data Sets (one or more big files)
- Write FileMark Immediate (streaming write)
- Write Metadata (Cartridge information)
- EOD: written by drive FW to end of write process

Write Append From EOD:
- Space EOD
- Space backward 1 filemark
- Read a filemark
- Read and save as old Metadata file
- Write (append) Encoded Data Sets
- Write FileMark Immediate (streaming write)
- Append new Metadata into old Metadata file
- Write Metadata file
- EOD

Read:
- Read ECTape ID: Identify if it is ECTape format
- If ECTape, then Space EOD
- Space backward 1 filemark
- Read a filemark
- Read and decode Metadata to find the target reading file
- Locate and read target Encoded Data Sets
- Decode data

Pros:
- Maximum Tape Capacity

Cons:
- Need 60 seconds (worst case) to read Metadata

Two Partitions ECTape

Partition 0: Meta partition

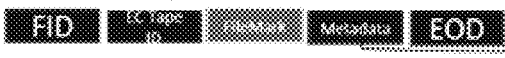

Partition 1: Data partition

Two copies Meta Data

Format:
- Partition 0: 2 wraps
- Partition 1: Remaining capacity

Write From BOT
- Partition 1
- Write FID, ECTape ID, FileMark, Meta Data
- Write Encoded Data Sets (one or more big files)
- Write FileMark immediate (streaming write)
- Write Meta Data (Cartridge information)
- EOD: written by drive FW to end of write process
- Change to partition 0
- Write FID, ECTape ID, FileMark, Meta Data, EOD

Write Append From EOD:
- Partition 0
- Read ECTape ID: Identify ECTape
- Partition 1
- Read ECTape ID: Identify ECTape
- Space EOD
- Space backward 1 filemark
- Read a filemark
- Read and save as old Meta Data file
- Write (append) Encoded Data Sets
- Write FileMark immediate
- Append new Meta Data into old Meta Data file
- Write Meta Data file
- EOD
- Partition 0
- Write FID, ECTape ID, FileMark, Meta Data, EOD (Overwrite Meta Data)

Read:
- Partition 0
- Read ECTape ID: Identify ECTape format
- If ECTape, then Read and decode Meta Data
- Partition 1
- Read ECTape ID: Identify ECTape format
- If ECTape, then Locate and read target Encoded Data Sets
- Decode data

Pros:
- Time to read Meta Data
- Two copies of Meta Data

Cons:
- Capacity: Less 4 wraps

FIG. 19

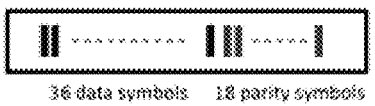
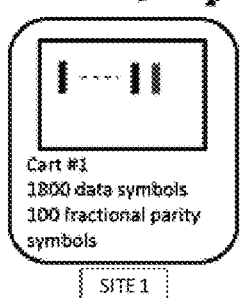
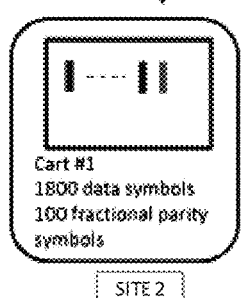
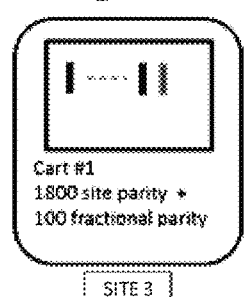
FIG. 23

| 4-Site Erasure Coding to High Durability Repair for Disaster Recovery | | | | | | | | | |
|---|---|---|---|---|---|---|---|---|---|
| K | D | P | # Sites | Loss of Site # | Symbols Lost/Site | Total Symbols Lost | Remaining K | Additional P/Site | Eff % | # Cart/Site |
| 16 | 12 | 4 | 4 | 1 | 4 | 4 | 12 | 0 | 75% | 4 |
| 16 | 9 | 7 | 4 | 1 | 4 | 4 | 12 | 1 | 56% | 4 |
| 16 | 6 | 10 | 4 | 1 | 4 | 4 | 12 | 2 | 38% | 4 |
| 36 | 27 | 9 | 4 | 1 | 9 | 9 | 27 | 0 | 75% | 9 |
| 36 | 24 | 12 | 4 | 1 | 9 | 9 | 27 | 1 | 67% | 9 |
| 36 | 21 | 15 | 4 | 1 | 9 | 9 | 27 | 2 | 58% | 9 |
| 40 | 30 | 10 | 4 | 1 | 10 | 10 | 30 | 0 | 75% | 10 |
| 40 | 27 | 13 | 4 | 1 | 10 | 10 | 30 | 1 | 68% | 10 |
| 40 | 24 | 16 | 4 | 1 | 10 | 10 | 30 | 2 | 60% | 10 |
| 48 | 36 | 12 | 4 | 1 | 12 | 12 | 36 | 0 | 75% | 12 |
| 48 | 33 | 15 | 4 | 1 | 12 | 12 | 36 | 1 | 69% | 12 |
| 48 | 30 | 18 | 4 | 1 | 12 | 12 | 36 | 2 | 63% | 12 |
| 64 | 48 | 16 | 4 | 1 | 16 | 16 | 48 | 0 | 75% | 16 |
| 64 | 45 | 19 | 4 | 1 | 16 | 16 | 48 | 1 | 70% | 16 |
| 64 | 42 | 22 | 4 | 1 | 16 | 16 | 48 | 2 | 66% | 16 |
| 96 | 72 | 24 | 4 | 1 | 24 | 24 | 72 | 0 | 75% | 24 |
| 396 | 294 | 102 | 4 | 1 | 99 | 99 | 297 | 1 | 74% | 99 |
| 96 | 66 | 30 | 4 | 1 | 24 | 24 | 72 | 2 | 69% | 24 |

ERASURE CODING MAGNETIC TAPES FOR MINIMUM LATENCY AND ADAPTIVE PARITY PROTECTION FEEDBACK

REFERENCE TO RELATED APPLICATIONS

This application claims the benefit of U.S. Provisional Application No. 62/675,979 filed May 24, 2018, entitled "ERASURE CODED TAPES WITH ADAPTIVE PARITY PROTECTION FEEDBACK FROM MEDIA FOR CAPACITY OPTIMIZED GEOGRAPHIC DISTRIBUTION", and the benefit of U.S. Provisional Application No. 62/808,452 filed Feb. 21, 2019, entitled "ERASURE CODING MAGNETIC TAPES FOR MINIMUM LATENCY" contents of which are herein incorporated by reference in their entirety.

FIELD

The present disclosure relates to magnetic tapes, and more particularly erasure coding of magnetic tapes to reduce latency and adaptive parity protection feedback.

BACKGROUND

Stored data may be protected against storage media failures or other loss by storing extra copies, by storing additional redundant information, or in other ways. One type of redundancy-based protection involves using erasure coding. Erasure coding uses additional redundant data to produce erasure codes (EC) that protect against so-called erasures. An erasure may be an error with a location that is known a priori. The erasure codes allow data portions that are lost to be reconstructed from the surviving data. The application of erasure codes to data storage may typically have been for the purpose of recovering data in the face of failures of hardware elements storing the data. Tape cartridges using Dual Reed Solomon erasure coding can achieve a bit error rate (BER) significantly lower than hard disk drives (HDD). HDDs, for example, exhibit non-Gaussian error modes that dominate the mean time between failures (MTBF).

Tape drives on the other hand often encounter errors during reading, including off track errors, media data errors, damaged tape, deteriorated tape, host drive speed mismatches, and other hardware and firmware problems. Conventional tape drives retry a read when an error is encountered. Retries result in repetitive repositioning, which combined with the high speeds of tape drives, leads to further deterioration and damage to the tape. The damage may include tape surface damage and air entrainment problems, which in turn lead to even more errors. Conventional tape formats do not necessarily have optimal useful approaches to deal with hard read errors, other than retries with repositioning. Thus, if the data in the damaged section (e.g., a couple of millimeters (mms) by a couple of mms of magnetic tape) cannot be read, conventional tape systems give up, even though the rest of the data on the tape is fine. Conventional systems therefore rely on tape backup copies to recover original data at the cost of overhead. However, the backup copies are also subject to the same errors, which may result in multiple unusable tape cartridges within a data storage system.

Erasure codes are often used to increase data storage durability, but come with the cost of overhead. However, the conventional deployment of erasure codes does not protect data from localized damage to tapes that is beyond the power of the systems internal to the tape system to correct. Conventional tape systems thus make multiple copies of cartridges, also known as replication, to achieve required levels of durability. For example, to achieve enterprise levels of durability, a conventional tape data storage system, even assuming errors were random, would require multiple copies of data. However, critical tape errors are not uniformly random.

LTO's internal error/erasure correction code/coding (ECC) system as used in conventional systems cannot efficiently deal with many types of hard errors, including lost cartridges, cut tapes, lost pins, environment issues, loss of magnetic coating, shock and vibration, edge damage, debris and particles, magnetic coating wear, or staggered wraps. For example, if a conventional system loses a cartridge because a robot dropped the cartridge or someone stole it, the data is gone, regardless of the BER or the ECC system employed. To handle these kinds of hard errors and achieve eleven nines or more of durability, conventional systems utilize at least six copies, potentially residing at different sites, which is costly and provides a significant tape management challenge. For example, if a file is distributed over 4 tapes to increase transfer rates but still needs to be replicated 6 times to achieve the desired durability, the system would need 24 tapes, which is not an optimal solution. Availability issues for a tape cartridge may occur at the tape level (e.g., lost tape, damaged tape) or at a system level (e.g., tape library robot down, unavailable).

BRIEF DESCRIPTION OF THE DRAWINGS

FIG. 7 is an example diagram illustrating an example scenario involving minimum reading to correct a local error pattern exceeding its own error protection, according to various aspects discussed herein.

FIG. 8 is an example diagram illustrating an example tape format for placing data chunks, according to various aspects discussed herein.

FIG. 14 is an LTO-8 example of interleaved erasure coded objects and reading over sections of tape with large correlated errors that failed by internal Tape ECC, in connection with various aspects discussed herein.

FIGS. 18 and 19 are examples illustrating the erasure coded tape formats including layout and meta data, in connection with various aspects discussed herein.

FIG. 23 is an example illustrating a rateless erasure code-based 3 site protection with fractional parity policy, in connection with various aspects discussed herein.

FIG. 24 is an example illustrating multi site erasure code selection for a disaster recovery mode, in connection with various aspects discussed herein.

DETAILED DESCRIPTION

Figure 1:
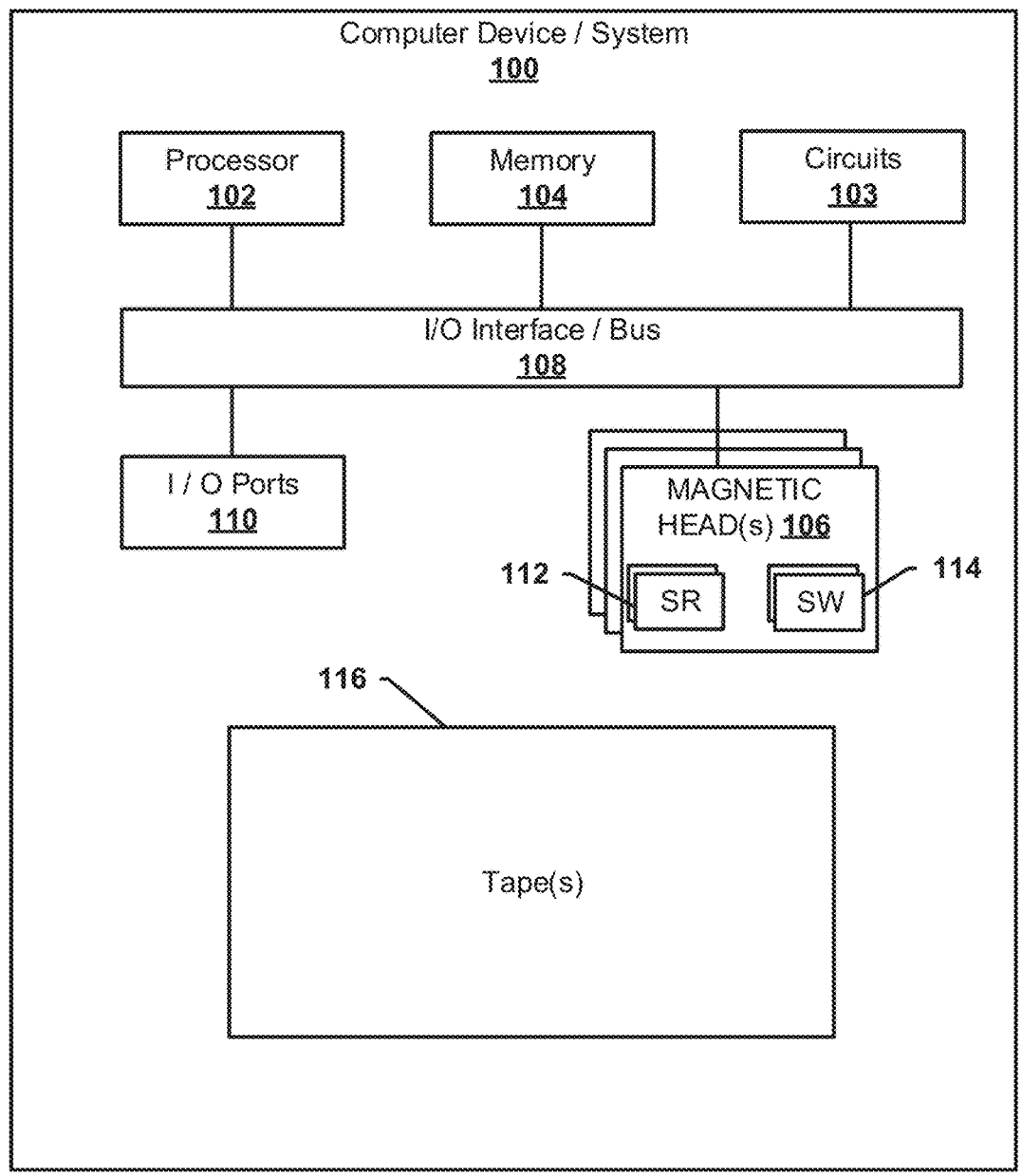
FIG. 1 is a block diagram illustrating a tape servo device or system according to various aspects (embodiments) described.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (UE) (e.g., mobile/wireless phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

Example methods and apparatus improve on conventional data storage approaches by using erasure coding to encode data and to distribute the data across one or more tape cartridges. Erasure coding can include fountain erasure coding, in which a fountain code is a rateless erasure code. Within individual tape cartridges, the data can be spread down the length of tape in interleaved records. Thus, the erasure codes are doubly distributed. Example methods and apparatus control tape drives to read from cartridges that store rateless erasure encoded data exhibiting errors without resorting to tape and drive damaging retry algorithms that conventional approaches use to recover data from damaged or worn-out regions of storage media.

Example methods and apparatus distribute subsets (e.g., chunks or fragments) of erasure codes to a plurality of different data storage devices, including magnetic tapes, which mitigates the impact of unavailable tape robots or drives, lost tapes, or damaged tape errors. Example methods and apparatus also write specific subsets of erasure codes to individual tapes in an interleaved fashion, which mitigates the impact of smaller, tape level errors that can be handled by a tape's internal ECC. Thus, the erasure codes can be doubly distributed, which facilitates handling errors in unexpected ways (e.g., ignoring read errors, ignoring buffer overflows). Example methods and apparatus read from the plurality of data storage devices and re-assemble the stored data while ignoring small tape errors, full tape drive caches, and host read buffer overflows.

In consideration of described deficiencies of magnetic tapes and erasure coding various embodiments/aspects are disclosed for achieving minimum latency and adaptive parity protection feedback from the media for capacity optimized geographic distribution. In particular, magnetic tape devices or systems can interleave chunks (or fragments) of code words (CWs) of an erasure encoded object or file to enable using a single magnetic tape only in response to a random object/file request and correcting for a local correlated error within the single magnetic tape itself without using another different magnetic tape as a first option.

An encoding logic component further utilizes other magnetic tapes to generate additional parity tapes that recover an error of the single magnetic tape in response to the error satisfying a threshold severity for a reconstruction of the erasure coded object or the CW, where the encoding logic is controlled, at least in part, by one or more iteration coding processes between erasure code dimensions that are orthogonal to one another. In response to not satisfying the threshold severity, the error can be corrected with the single magnetic tape alone.

An interleave component interleaves chunks of a CW of one or more other different magnetic tapes with chunk(s) of the CW into a plurality of records, distributes the plurality of records across the data storage devices (e.g., other magnetic tapes), and interleaves the one or more chunks of the CW across the single magnetic tape with at least one of the chunks of the one or more CWs associated with a different magnetic tape of the plurality of data storage devices. The interleave component or encoding logic further generates one or more additional parities from one or more chunks of the CW with corresponding parities and distributes the one or more additional parities to different parity tapes, respectively.

Iteration and interleaving using orthogonal multi-dimensional erasure codes where each user file (or data object) is written to an individual tape and where these tapes are protected by the other dimension using multiple tapes enables the various aspects herein. In particular, iteration process with the erasure codes of chunk(s) of CWs can minimize the erasure code overhead and still achieve very high durability without increasing cost due to excessive overhead. Use of iteration and multi dimensions collectively achieves this.

In one example, two dimensions can be utilized. One dimension is per tape or a single magnetic tape, where the second is multi-tape. Each erasure code (EC) policy can be configured for a specific probability of errors being seen such as a per tape policy that can be designed for local tape errors, which are more dominant compared to loss of fully damaged tapes (or severely damaged). The multi tape dimension can be configured for the probability of loss of damaged tapes where the error probability (or severity) is different compared to per tape. The orthogonality and correlation between the dimensions plus the unique interleaving increases the durability without requiring both dimensions to have more parities that can increase overall storage overhead and cost. The interleaving helps with the power of iterative erasure decoding erasure codes with iteration so these operations are correlated as technologies among dimensions.

With interleaving by iteration, data chunks from the same codewords across multiple tapes can be arranged such that they are not correlated as a function of tape position (e.g., if all chunks are written at beginning of tape (BOT) or a beginning portion/fraction of each tape a systematic tracking error at BOT will result in erasure coding to be useless), the decoder (decoding component) can use iterative decoding to achieve very high durability with low overhead.

Erasure coding files such that they are each written to individual tapes can be ideal for tape applications where latency to the first user byte is critical such as active archive application(s). With disk applications, erasure coded user files can be spread across multiple disks and because disks are always online and available this does not affect latency, but helps it. However, with tape the use case is totally different. Tapes are usually offline, and only online when they are loaded into drives. Additionally, in all tape applications, the library systems have a ratio of 1 drive per N tapes where N is typically about 100. This can require a different erasure code concept compared to disk application.

If parity is set to a per tape dimension, the same low latency can be achieved, and the failure rates in tapes being very high due to interactions between drives and tapes. This is because of the removability of media and the drive, unlike disk drives. Local sections of tapes can be bad or lower quality of magnetics or tape surface edge physical problems making the system encounter errors and delays during the read which will increase latencies in a different way. A per tape dimension for EC can solve this especially when the drive is commanded to read data with errors without stopping or performing re-tries. So the multi dimension interleave plus read without stopping all collectively help to reduce the latencies. Further, the probability of a total tape loss or pin drop or tape cut is very low like less than 0.1%. However, the probability of tape and drive having extensive delays due to various retries that some may result in errors is much higher like 4-5%.

Another benefit of using multi dimensions where local tape errors are fixed on the fly without stopping tape during read is the prevention of tape damage due to physical back hitch motions during drive retries due to local tape errors. When a disk has an error, the drive does not stop and restart, the head component simply waits for the data to come back in next disk revolution. With tape, the drive stops, goes back, stops and restarts to re-read the bad section and does this multiple times until it recovers data. These back hitches result in tape damage and impact data durability negatively. The method(s) described herein eliminates these since with a per tape dimension, and reading without stopping eliminates back hitches during read, increasing life and durability of media. To note, each media has a limited number of passes across the head and as capacities increase each generation, the number of tracks also increase, but number passes for EOL (end of life) is basically the same as previous generations. Elimination of back hitches during reading, can improve efficiency with respect to the tape wear, especially since current methods increase pass counts due to read retries and back hitches.

Another benefit of multi dimension where local errors are corrected by the per tape dimension is the ability of self-repairing suspect or locally damaged tapes without requiring other tapes. This helps with drive resource management and also due to local rebuild characteristics using a per tape erasure code dimension where erasure coded chunks are also interleaved over the tape, which helps with 10 bandwidth requirements/throughput. According to the various aspects/embodiments, a drive can be configured to repair a tape using its internal hardware and logic without requiring the repair to be done at the higher host level adding to the benefits herein.

In other aspects, a self-description of the tapes in themselves can be used without any hardware to reconstruct the entire data set after a disaster event where only the tapes may be available. This can be included in the multi dimension erasure coding so one can replace a tape or tapes from a set of erasure coded tapes and the meta data that goes with the tapes and new tapes is able to describe the correlation between the original user files and tapes.

In another aspect, quality metrics can enable differentiation between drive and tape errors so one can focus on the durability quality of the data written on tapes mainly. As such, the tapes can be configured to have an original data quality (e.g., defects, random errors, tracking all as a function of the physical tape position using LPOS and wrap numbers) at the time of the originally writing data and keep/store this meta data at/for each tape with the identification of drives that write the data and environmental conditions at the time of writing. Now either as part of reads when a user requires data or pre-planned scheduled tape scrubbing, the tape device/system can read the quality metric data from the tape(s) and use these to compare them to the original writing to estimate if there is a change in quality or condition satisfying a defined threshold substantially change to migrate the tape to a new one. Tape scrub can be defined as a deterministic manner to read physical locations on a tape to capture the quality metrics. This can be randomly selected locations to save some and pass a number of full volume test, which tests the entire tape surface based on policy.

Additional aspects and details of the disclosure further described below with reference to figures.

FIG. 1 illustrates an example computing device or system that example operations, systems, apparatus, or methods described herein, and equivalents, can be processed or operate as a tape servo device or system. The example computing device/system 100 can be a servo device that includes a processor 102, a memory 104, magnetic head device(s) 106 and input/output ports 110 operably connected by an input/output (I/O) interface or an external/internal bus 108. The computer device 100 can include communication or processing circuitry as circuit(s) 103 configured to facilitate providing data or processing working sets of application data to adaptively read or write a magnetic tape 116 via one or more servo readers 112 or servo writers 114, which can also be referred to as servo read heads or servo write heads that have signal processing circuitry (e.g., coils or the like) to read or write data with the magnetic tape 116.

In different examples, circuit 103 can be implemented in hardware, software, firmware, or combinations thereof. While circuit 103 is illustrated as a hardware component attached to the bus 108, it is to be appreciated that in one example, circuit 103 could be implemented in the processor 102, such as a system on a chip (SoC), single integrated chip, microcontroller or the like. In an example configuration of the computer 100, the processor 102 can be a variety of various processors including dual microprocessor, controller, or other single/multi-processor architectures. A memory 104 can include volatile memory and/or non-volatile memory. Non-volatile memory can include, for example, ROM, PROM, or other memory. Volatile memory can include, for example, RAM, SRAM, DRAM, or other memory.

The I/O interface/bus 108 can be a single internal bus interconnect architecture and/or other bus or mesh architectures. While a single bus is illustrated, it is to be appreciated that the computer 100 can communicate with various devices, logics, and peripherals using other busses (e.g., PCIE, 1394, USB, Ethernet). The bus 108 can be types including, for example, a memory bus, a memory controller, a peripheral bus, an external bus, a crossbar switch, a local bus, or external/internal interface.

Tape can be a lower cost compared to disks; however, when a device demands to be configured for a high durability application for long retention periods, the protection is provided by either replication or erasure coding methods just like in disk systems. Replicated tapes offer good performance, but at a higher cost of ownership due to excessive storage overhead compared to erasure code (EC) systems. Current legacy systems use replicated tapes to store the user data with 2 or 3 copies.

A reason why replication may be a preferred method over erasure coding for the tape-based applications is the architectural difference with tape and disks. Disks are typically connected to local servers so when a user device accesses a file, the latency is very short even with erasure coded applications. For example, assume a 12/4 erasure code policy where user data is encoded and spread over 12 storage nodes with 8 nodes are for data chunks and 4 nodes are for parity chunks. For a given user file, the system would utilize data chunks from any 8 out of 12 disks and since all 12 disks are online attached to a server, the latency is very short provided that the number of struggler disks are less than 5, for example. Now if a tape device or system utilizes the similar EC concept for the tape, it also would read any 8 out of 12 tapes just like the disk systems. However, unlike a disk system, tapes are offline devices and utilize robots and tape drives to be loaded for reading. In a typical library with dual robots, for example, the ratio of cartridges to drives is typically 100:1. With limited drive resources, the requirement to load any 8 out of 12 tapes to read a random file increases latency to the first user byte due to potential drive unavailability. Since with replication, each file is stored in a single tape, this problem is not the same as it is with the erasure coded tapes. Therefore, the cost and durability benefits of erasure coding with tapes are typically negated by the high latency issues due to limited drive resources. While reading an erasure coded file with tapes, the fact that one needs a number of tapes to read at the same time makes the application of erasure coding with tape systems a challenging one to deal with.

In disk applications, for example, the files can be erasure coded and split into chunks where each chunk is written to a different disk in a different node in a different rack in a different data center and potentially in a different geographic location. In tape devices/systems the same process could result in high latencies. As such, embodiments/aspects herein use local recoverable codes (LRCs) where files are erasure coded using multiple tapes. However, to be able read a given file a single tape can be used where the single tape is part of the overall erasure code topology; multiple tapes are only required when there is a severe error or unavailability (e.g., based on a severity threshold) so the probability of latency problem is reduced substantially based on the unique erasure coding and data chunk distribution algorithm. This can keep the latencies to first byte low, while lowering cost and increasing durability due to erasure coding with multiple tapes.

In an aspect, multi-dimensional erasure codes are configured via the tape device/system 100 such that each file with local parity protection is written to a single tape (e.g., 116) providing low latencies, but a set of different files can be erasure coded across multiple tapes generating additional parity tapes. The use of this as multi-dimensional erasure codes permit to use a single tape when a random file is requested and still be able to correct for local correlated random errors within that tape and in case the error condition is severe enough that the local code is not able to help with reconstruction, the other tape(s) from the set of tapes are requested for the rebuild or reconstruction of the data from any error.

In one example s-dimensional product codes can be configured in which every component code in each dimension can be utilized as a parity coding. In this case, the rate of the code can be represented by at least one of the following representation:

$$\left(\frac{r}{r+l}\right)^l,$$

where l is a number of code symbols that can be repaired by contacting at most r other code symbols.

In another embodiment, as a second further aspect/option two: 2-dimensional product codes, in which every component code (chunk/fragment) uses (n, k) MDS codes, can be configured, generated or processed. The codeword length of each component code can be variable as well and be a different length from among codewords of a tape.

Figure 3:
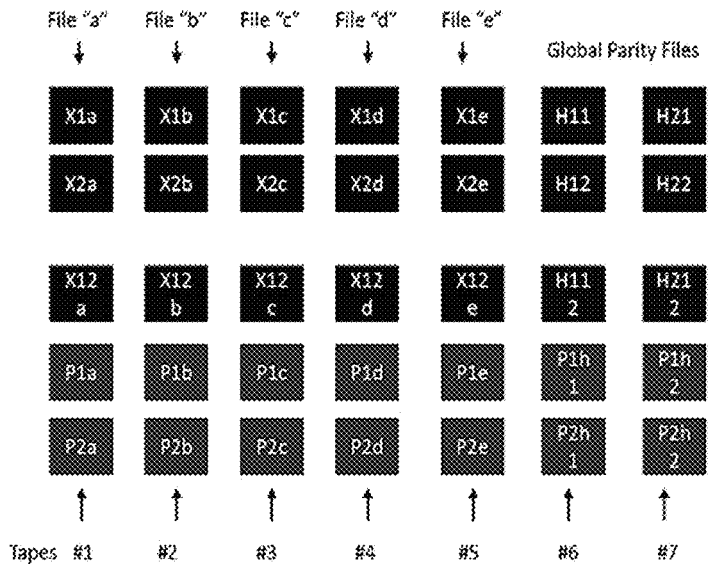
FIG. 3 is an example diagram illustrating an example of a 2-layer Erasure Code Concept in connection with various aspects discussed herein.

Alternatively, or additionally, the codes can be the same length, as illustrated, for example. Moreover, codewords can be generalized to s dimensions the same way just like in the embodiment or option one above, for example. An example configuration 300 for two dimensions is also illustrated in FIG. 3 for encoding multiple files. The rate of 2-dimensional (and/or s-dimensional for that matter) product codes in which every component code using (n, k) MDS codes has the following rate constraints, respectively:

$$\left(\frac{r}{r+l^2}\right)^2, \left(\frac{r}{r+l^2}\right)^s.$$

In another embodiment, as a third further aspect/option three: Concatenated MDS codes in which each partition of the data is encoded with an independent (n, k) MDS codes can be configured, generated or processed. Due to this independence, such codes can allow worse reconstruction properties compared to product coding, in which iterative decoding is possible and hence better recovery/reconstruction possibility. However, this independence enables a better locality property. The rate constraint of the concatenated MDS coding is given by (with the constraint $l^2 \geq r \geq 1$) by the following expression, which is higher than the achievable rates using product codes:

$$\frac{r}{r+l^2}.$$

Locality is one property of focus for tape that can be used to generate product coding as a function thereof. This locality of a single magnetic tape is a main relevant property as far as cold storage is concerned, and where tape systems in particular are concerned due to scarce robot and drive resources. The proposed embodiments/aspects herein can be applicable to s-dimensional product codes where in different s-dimensions, where maximum distance separable (MDS) coding can be employed. Two and three dimensional product code structures 200 and 300 are illustrated in FIGS. 2 and 3, for example.

Figure 2:
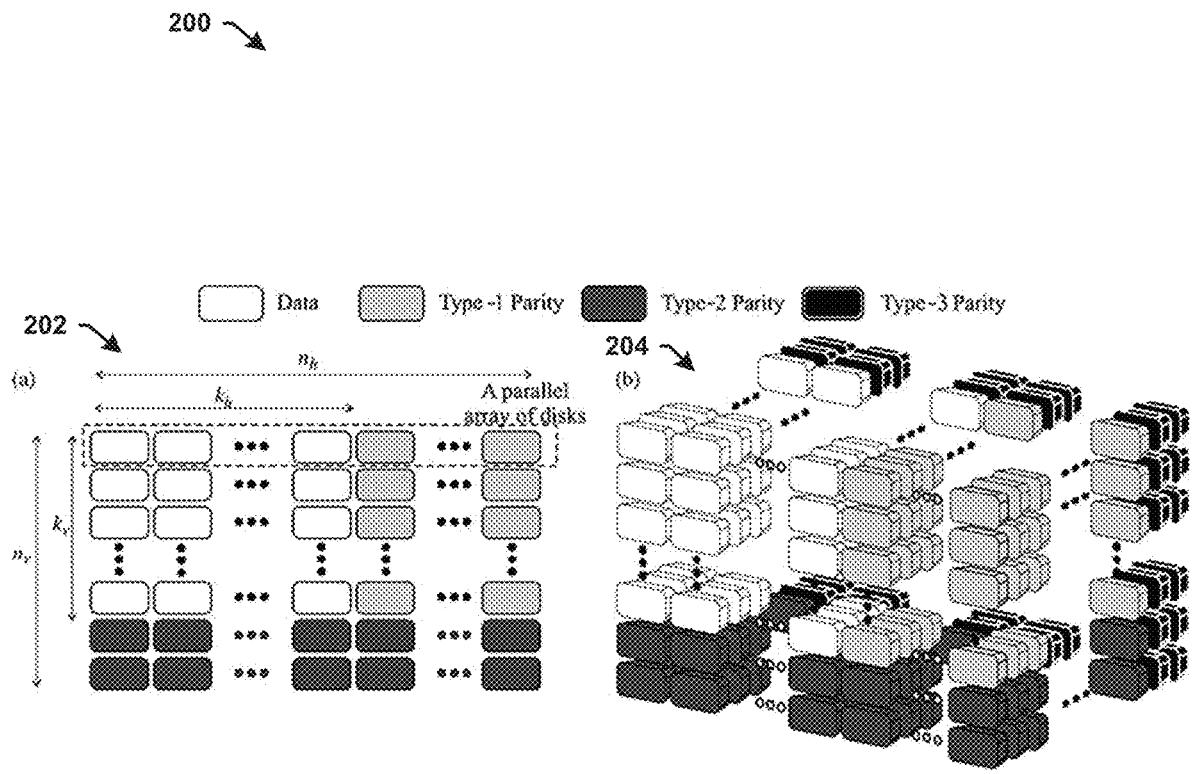
FIG. 2 is an example diagram illustrating examples of 2-layer and 3-layer product coding, according to various aspects discussed herein.

Referring to FIG. 2, illustrated is an example two layer 202 and three layer 204 product coding. Rows from left to right represent a parallel array of disks (or magnetic tapes) with an associated parity. The locality property of a single magnetic tape can be based on the number of accessed nodes. In other words, any set of l code symbols can be repaired by contacting at most r other code symbols. This can be known as (r,l)-locality. It can be shown that this locality for any given code can put a constraint on the rate of the code, in which few options are otherwise available to provide locality as far as product codes are concerned. Alternatively, or additionally, consideration of locality with recoverability can be processed by the tape device with the tape 116, for example. In tape applications, errors are not usually single, but rather multiple that can be spread along or across one or more tapes 116. Thus, the device 100 can utilize the processing (e.g., as by reading/analyzing) or generating (writing/over-writing/manufacturing) of product coding with good locality properties (with high enough rate), BOT, EOT-aware allocation strategy that is based on the tape format in spirit and low complexity iterative decoding to boost recoverability performance as well as reduce the computation complexity in partial recoveries (directly related to locality requirements).

Tape can have a problem when erasure coding is used. For example, if there are ten tapes with a data file or object and a number of data chunks (e.g., 8 or the like) and have up to two errors. Once the data gets chunked into 8 data chunks after being processed through Reed-Solomon algorithm to calculate two parity chunks, these ten chunks can be written to ten tapes. If the ten new chunks are loaded into the drive, the drive(s) have to be available first; however, if they were all written at beginning of tape (BOT), an increase of tracking errors could exist. Therefore, the processor 102 or one or more logic components can operate to generate (e.g., write/re-write/over-write) erasure code across an individual magnetic tape, or different magnetic tapes as a function of a variable location such that BOT, end of tape (EOT), middle of tape (EOT), or other section along the tape(s) are taken into account and varied, for example. This can be advantageous, for example, at a later date or time when the data is read from the tape 116, for example, placed in a drive (magnetic head reader 112 or the like device) of a cartridge and a large percentage of the tapes have tracking problems, thus the erasure code being rendered useless.

In this example of FIG. 3, user files can be containerized into fixed size blocks of data. Each container is erasure coded using the LRC or Per Tape Erasure Code (PTEC) to generate n chunks where k chunks are data and (n-k) chunks are local parity. Each container with (n, k) LRC can be written to a separate tape so latencies in the read mode is minimized, such as via an encoding logic component or other logic component of the device 100, for example.

Figure 4A:
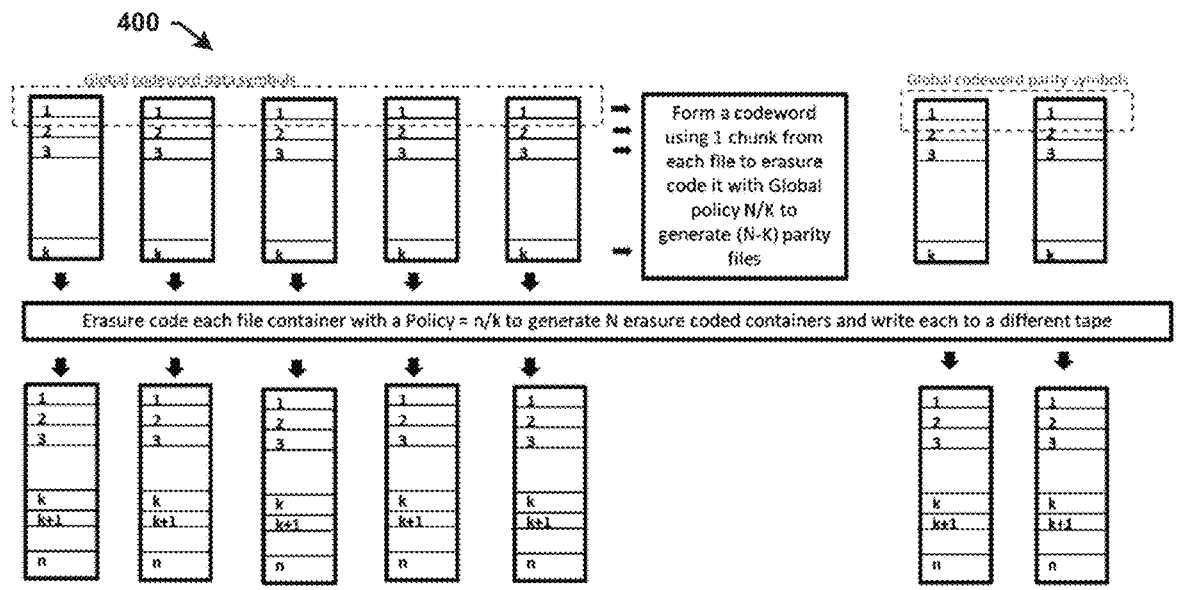
FIGS. 4a-4b are example diagrams illustrating different encoding processes, in connection with various aspects discussed herein.
Figure 4B:
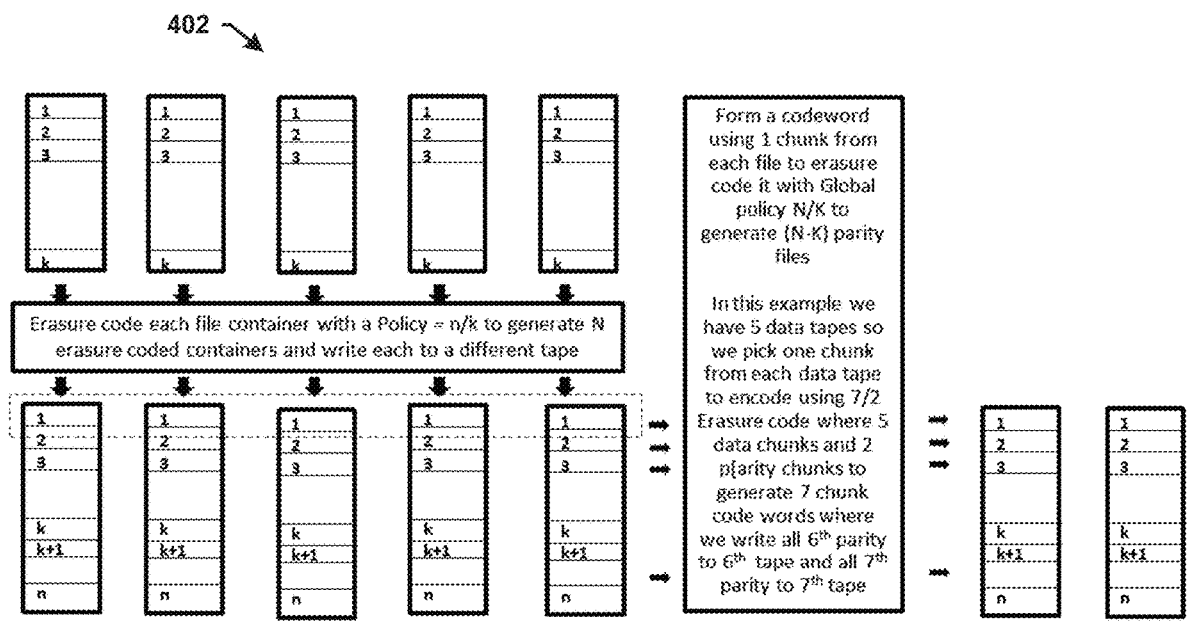

For example, N/K can be the global multi tape erasure code policy where N is number of tapes and K is data tapes and N minus K (N–K) can be the global parity tapes. With K data tapes for the Multi tape erasure code policy of N/K, the device 100 can form k/K global codewords from K files each with k chunks. FIGS. 4a-4b illustrate examples of these erasure codes or codewords 400, also known as product codes.

The selection of erasure codes 400, for example, with multi dimensions can be optimized for types of error conditions one protects data against such as protect against 2 or 3 cartridge failures where media or data is totally damaged, or cartridges are lost plus N number of random errors where the errors might be clustered in certain cartridges or distributed randomly across all cartridges. This can serve or define a threshold severity or a severity threshold herein, for example.

When reading random files, device or system 100 can load only the requested cartridges (with tape) that has the files needed into the drives. When during the read process, if errors are encountered such that tape format ECC cannot resolve, the local n/k erasure code is used to reconstruct the lost sections of the file, so system still uses the single tape to recover data. In cases where the error event is too big only then the other tapes can be loaded in response. This process employs erasure code with tapes 116 without being impacted negatively by the latency problem yet able to achieve low cost and high durability. Depending on the power of LRC, the device/system can resolve most common errors without requiring the other tapes from the set making this a powerful method for tape applications.

With multi-dimensional erasure codes, the system can recover/reconstruct/restore data from many error events making this system a maximally recoverable device/system 100 with local reconstruction capability where only single tape is required to read a random file even with multiple error events during the read without the assistance from the other magnetic tapes.

The processes for erasure codes 400 can include erasure code for each file container with a police=n/k to generate N erasure coded containers and writing each to a different tape. The erasure codeword data symbols can be used to form a codeword using one chunk from each file to erasure code with a Global policy N/K to generate N–K parity files.

As to where erasure codes 400 and the demonstrate processes for generating these can form two multi-dimensional erasure codes, for example, erasure codes 402 of FIG. 4b demonstrate other aspects for generating multi-dimensional erasure codes. The processes for erasure codes 402 can include erasure code for each file container with a police=n/k to generate N erasure coded containers and writing each to a different tape. A codeword can be formed using one chunk (portion of file) from each file to erasure code with global policy N/K to generate N–K (N minus K) parity files. For example, five data tapes are illustrated and one chunk from each data tape is selected to encode using 7/2 erasure code where five data chunks and two parity chunks are used to generate 7 chunk code words where all $6^{th}$ parity are written to $6^{th}$ tape and all $7^{th}$ parity to a $7^{th}$ tape.

Figure 5:
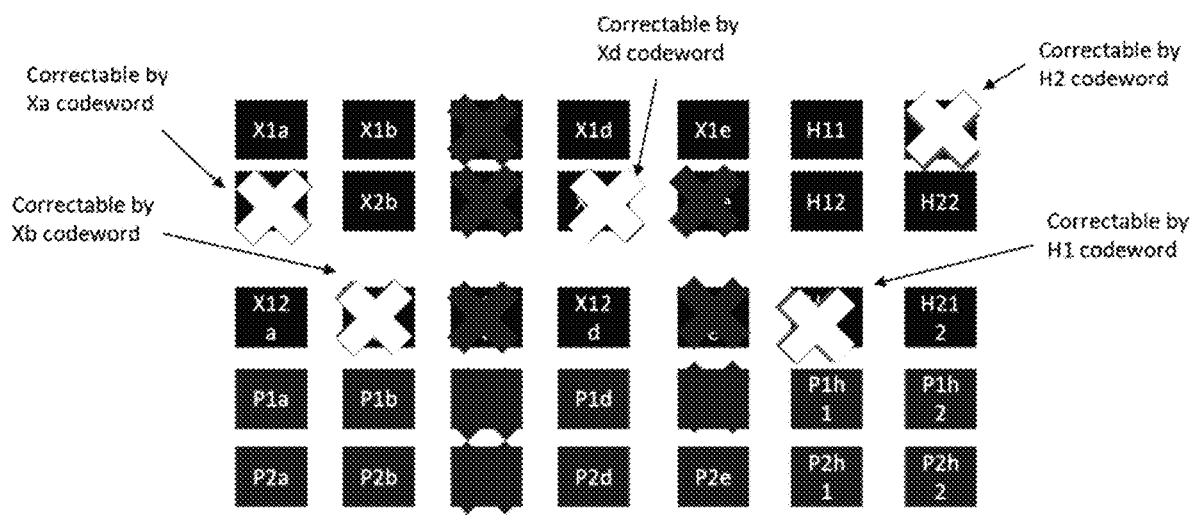
FIG. 5-6 are example diagrams illustrating an example scenario of a typical error case, where a system has lost a full cartridge and has multiple errors, yet is able to recover the user data according to various aspects discussed herein.

Referring to FIG. 5, illustrated is an example of an error case where a multi-tape erasure coded system 500 has lost a full cartridge and has multiple errors yet is able to recover the user data.

Here, the tape device or system 100 can use multi-dimensional erasure codes such that each file with local parity protection is written to a single magnetic tape providing low latencies, but different files are erasure coded across multiple tapes generating additional parity tapes at and among each of the magnetic tapes, as a per-tape dimension and a multi-tape dimension of interleaved erasure code. The use of this multi-dimensional erasure codes permits using a single tape when a random object/file is requested and the device/system is still able to correct for local correlated random errors within that tape. In the case where the error condition is severe enough by satisfying a severity threshold (e.g., as completely damaged or full data set error being unrecoverable) where the local code is not able to help with reconstruction, the other tape(s) from the set of tapes are requested for the rebuild and utilized to reconstruct/restore the magnetic tape, object, file, data set, metadata thereon or parity.

Erasure coding can be a forward error correction code where both encoding and decoding are utilized. Erasure coded tapes can provide low latency to a first byte of user data, high durability with low storage overhead based on orthogonal multi-dimensional forward error correction codes by utilizing iterative decoding processes, such as by a local per-tape dimension and a global multi-tape dimension. User files can be encoded based on the dimensions and each encoded user data file with corresponding parity is written to an individual tape resulting in a set of individually erasure coded data tapes, where additional parity tapes can be generated using the other dimensions from the erasure coded data tapes generating orthogonal multi-dimensional erasure coded tapes.

During the restore process, the user data files can be decoded using individual tapes where local per tape errors beyond the tape's internal format ECC power are corrected using the dimension that pertains to the per tape erasure code. Errors beyond the capability of per tape dimension of the erasure code including the loss or complete damaged tapes can be corrected/re-written using the remainder of the tapes belonging to the multi-dimensional erasure code set of tape where the erasures are corrected using iteration between the orthogonal code dimensions back and forth. As further discussed infra, Interleaving can be utilized on multi-tape and per-tape (local and global protection) as a function of randomizing correlated errors.

In an aspect, read operations can function by non-stopping where there are one or more errors for one or both local and global protections to minimize tape wear and performing any action to maintain a streaming mode. In a stream mode of for example the drive reads the tape with errors and provides user or host the full or even partial data sets. A data set is the tape's internal data sets similar to disk drive sector. As the drive operates to read it can stream through and give partial or full data sets as it recovers without stopping and let erasure coded tape set to recover the user data.

When writing to tapes with multi-dimensional orthogonal erasure codes, this can be an asynchronous operation where erasure encoded objects/files using a per tape dimension are each written to different magnetic tapes without waiting for others. The writing can be a per tape dimension independent of one another, wherein a writing of parity tapes from data tapes using a multiple data tape dimension is performed during or after the writing of the data tapes making the writing process an asynchronous independent process. A reply back can then be sent to one or more user devices that the data, files, or objects are written to the tapes with erasure coding as the per tape dimension is written to individual tapes where the writing of the parity tapes writing proceeds during or after the reply back, for example.

Figure 6:

Referring to FIG. 6, illustrated is an example of the tape 600 correction capability of the multi-dimensional erasure code with the tape application from above in FIG. 5. By selecting optimum code configuration(s), the device or system can recover from a number of severe error cases including loss of two full tapes plus other random errors cases all with minimum storage overhead. Cade design and selection can be critical for robustness and durability. Reed Solomon or simpler parity codes can be used for fast execution. Use of row-column iterative decoding can provide high durability with low storage overhead, for example.

Referring to FIG. 7, illustrated is a tape 700, for example, that is being read (e.g., Tape #3) has more errors than its local protection. The device/system 600 can reconstruct the data without having to read all 7 tapes, but only selected row and column data chunks. This method enables the use of optimum parity protection structure to provide highest durability for a maximum number of error patterns with a minimum storage overhead for both local and global parities lowering the system cost. With local protection 12/2, the tape #3 has 4 errors, 3 data and 1 parity chunks, for example. The local erasure code can fail, and other tapes can be loaded from the set. The goal is to read minimum data to rebuild the partially failed tape.

Device/system 100 can select data rows, 1, 2 and 12, for example. Then the device/system 100 can read row 1 data chunks from all tapes and compute the X1c chunk in Tape #3 by reading chunks from row #2 from all tapes. Next it can read row #2 to compute rebuild X2c for tape 3. Now it reads row #12 and sees that this row has more errors than its global protection. So the system can then read the tape #5 column to correct X12e. Once this is done, now it can go back and recover X12c by decoding row 12. Once this data in tape 3 is recovered, it can be given back to the user. Once this task is done, tape #3 may also be replaced by a new tape and data after full correction including P2c. This method can utilize the matrix of erasure code (known as product code) system to recover data reading minimum amount of data.

Erasure code policy can be n/k=12/2, for example for local tapes and n/k=7/2 for global tapes, where n can be a total codeword size and n-k a number of parities as a parity size, in general for example. If the device is reading the tape #3, but it has more errors than its local protection allows, then other tapes can be loaded from the set and select rows 1, 2, and 12 (e.g., data rows with errors in tape #3) only to correct. These rows can then be used only to correct the tape #3 chunks in errors. Chunks #12 can fail since row 12 has more errors, and thus use Tape #5 to correct the error and use Tape #5 column to correct the error in its cell. Once done, the device/system 100 can correct the row 12 and have the data in Tape #3 even without needing to decode. As such, a minimum data can be used from the matrix to decide the errors in Tape #3 without reading the entire 7 tapes, for example.

Other features/aspects/embodiments that can support this multi-dimensional erasure coded tapes include reading with errors without stopping, high speed re-order reads, embodiments for writing and spreading (interspersing) chunks of codewords or CWs on tapes, and self-describing meta data corresponding to erasure coded tapes.

With respect to reading with errors without stopping, a decoding component of the device 100, upon detecting an error in a tape cartridge or the single magnetic tape, where the error is less than a threshold severity, can control a tape drive (e.g., device 100, processor 102, head or other component) to skip the error without stopping a read operation and to continue reading from the tape cartridge to enable reconstruction of the erasure encoded object from the single magnetic tape before reconstructing from among the plurality of data storage devices (e.g., memory 104, or with the other magnetic tapes 116, such as globally distributed tapes or the like). The read operation, for example, can be performed without stopping (e.g., by a drive, head 106, or the like) of providing data from recovered data sets associated with the erasure encoded object by at least a partial data set of the recovered data sets. A data set can be a fixed size of collection of records based on a format of the single magnetic tape constructed from data chunks. The data chunks can be generated from erasure coding, for example. The tape drive operation also plays an important role to make sure the drive/head does not stop on errors but streams through the error locations (e.g., when in a stream mode of operation). This process can be beneficial for tape life and durability and also lower the overall data latency to last byte by allowing drive to read with errors without stopping.

Oftentimes, for example, when there is a read error the drive automatically stops, tries to read again, fails again and a hard disk data error can result. The reader 112 or head 106 could go to a different spot along the tape 116, farther away, and continue to repeat the process, thereby resulting in further wear or tape errors by continually re-positioning/re-starting to compensate for the error.

As such, in an aspect, the device 100 can skip a particular section or location(s) of the tape 116 and read the rest of the tape in spite of one or more errors; where otherwise, all the motions of stop, start, re-position, etc., can still result in missing data, and not only missing the data set in error, but part of the good data that could have been read.

In one example, the data set that was in error on the tape 116 right could be about 100 mms, or 70 mms and may not be feasible or possible to stop, start, and lock in within 70 mms. An error as small as a 2 mm by 2 mm within a data set error can make that data set invalid, in which an error of about 70 mms long results in meters of data loss, before or by the time this portion is skipped over. As such a new motion, or new mode for this basically can be implemented by the processor 102 or head 106, for example, to read the data in error, if the drive is in error the device can read it and continue going, enabling the system to evolve setting the tape drive, which is on erasure code, to correct these errors on the fly, eventually coming to a region that is good and keep reading it. While reading the good region, the erasure code system sitting above can determine whether it has good data or a bad data chunk, and continue forward to get good data, decide if it can recover the data and keep going or performing the read operation. However, if the erasure code sitting on top still cannot recover, then it could go back and do some re-tries at a later time, while taking re-tries out from the drive, push it up to an upper level, and totally eliminate the re-tries and re-positions during the operation, which can eliminate error enframement stagger runs, for example, and extra tape motions.

In another aspect, high speed re-order reads can be configured. The performance can be optimized, for example, by combining a variable tape speed mode of operation with the reordered reads, so that the drive does not stop and reposition tape as it transitions from high speed search/locate to read mode. The drive can move up to high speed and ramp down to read speed using Time-Position Optimum Tape Speed Control processes, for example, such that it minimizes time while eliminating latency and tape wear causing under-runs due to stopping, repositioning and restarting at read speed every time it transitions from search to read speeds. This will not only minimize times but substantially lower the under run or repositions. When reconstructing the error chunks as shown in FIG. 6, for example, the variable speed re-ordered reads can enable searching data chunks at high speeds (relative to the read mode of operation) and read them without stopping and repositioning tape, which can reduce the overall reconstruction time and prevent tape wear. The algorithm process (as referred to as a variable speed re-ordered reads) can be based on tape speed and position being controlled using time optimum control trajectories to achieve minimum time and minimum tape media wear while reading random files or objects from the same tape.

Referring to FIG. 8, illustrated is an example tape format configuration 800 for placing data chunks of codewords of erasure code for writing and spreading chunks on tapes.

When writing a tape with erasure coded column data (e.g., column #1 or the like), the symbols are spread to randomize location dependent errors. Due to serpentine feature of tape recording, the location of chunks containing symbols from an erasure coded group can be arranged such that an error is a randomized potential correlated error event. For example, a (48/4) policy (44 data, 4 parity totals 48 symbols per code word), the device 100 can avoid aligning chunks at the same longitudinal location of tape such that an edge damage can potentially cause all chunks written on that section of tape to be in error causing error amplification. This method avoids these types of correlated error cases by randomizing the location based on the format of the tape.

This can also apply to spreading/interleaving across multiple tapes (e.g., interleaving chunks or fragments of codewords). As seen by the figures discussed above (e.g., FIG. 2, 3 or the like), a given row of data chunks belonging to the same codeword can reside on different tapes 116. Thus, while writing it to the tape if these chunks are all written to the BOT or EOT of the tapes then a correlated error scenario could be formed such that if common BOT errors are observed then most chunks might be in jeopardy potentially resulting in a decoding failure. By randomizing the locations of a given row codeword data chunks on or across different tapes such that the correlated errors are minimized based on tape magnetic and servo characteristics (BOT and EOT are known difficult positions for off track events with tape drives), the erasure code power is maintained otherwise non-random correlated errors can lower the correction power of codes, as further illustrated in FIGS. 6-7, for example.

Figure 9:
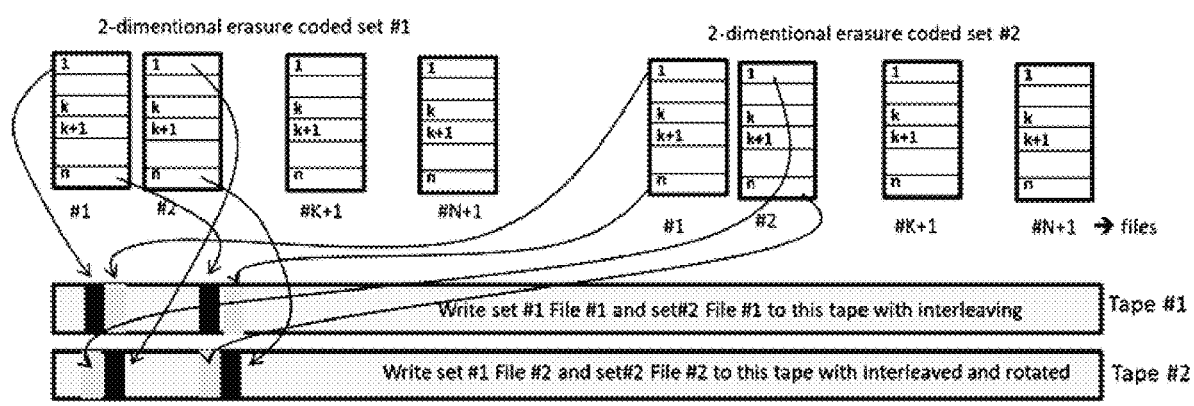
FIG. 9 is an example diagram illustrating an example of 2-dimensional interleaving, according to various aspects discussed herein.

As in FIG. 8, for example, multi-dimensional interleaving can be used to format the tapes such that correlated error patterns are minimized. The interleave operation can be important to protect against correlated errors. For example, if for a given codeword symbol chunks are all written at the beginning of tapes (BOT) and drives have tracking related problems at BOT, then the correlated errors can result in data loss or data unavailability even with the multi-dimensional erasure codes. Therefore, interleaving as part of the erasure codes to provide robustness to correlated tape errors can be useful. In the case of 2-dimensional product code scenario, multiple sets of user files or objects can be used to interleave erasure coded files down the tape such that symbol chunks belonging to the same column codeword are not adjacent down the tape and also symbol chunks for the row codeword belonging to the multiple tapes are not written to the similar tape positions such as all at or near a beginning of tape. This can be accomplished using a deterministic rotation algorithm process as illustrated in FIG. 9 at the configuration 900, for example, using 2-dimensional interleaving.

Here, at the configuration 800 a local and global code example is shown where data chunks on each row can be written to a different tape by the magnetic head 106 or the device 100. Each row of chunks can belong to the same codeword to randomize their locations such that there is no correlated position on or among the different tapes by ensuring they are not all written at BOT or EOT, or the same section of tape, for example. Column data chunks can all be written to the same tape. Their locations can all be randomized on the tape such that they are not aligned laterally where a cross track error cannot wipe out more than one chunk from any column sector on a single tape.

In an aspect, the device 100 can be configured to recover data much faster with an additional dimension of erasure code that can provide multiple regions on the same tape. For example, erasure coded data can be provided across multiple tapes (e.g., ten tapes or the like) with 8 data tapes and 2 parity tapes, with each of those ten having the local erasure code also as a second dimension to have both local and global erasure coded data, as well as parity. Then if a local error occurs, a correction can be applied at the tape erasure code layer, and thus eliminate the need to get the same data from the other tapes. Data can be recovered from the local section, the erasure code section of the local tape. This improves the speed performance, lowers the 10 bandwidth requirement and makes it much more user friendly, unless this error, FIG. 9 illustrates an example of two-dimensional interleaving 900. Each erasure coded file can be written via the device 100 to a tape 116 and the chunks from this file can be interleaved by the chunks from another file that can be written to a same tape 116 to provide randomization of locations on the tape. Further, files that are to be written to the other tapes (as a global dimension) can be interleaved in the same manner, but in addition to the data chunks, for the same row of codewords across tapes can be rotated so a given codeword symbol or set of symbols for a row can also be randomized in position across the multiple tapes, resulting in a two-dimensional interleaving down and across tapes.

In an embodiment, meta data can be configured for self-describing erasure coded tapes. For example, a special partition can be designated/assigned on tape(s) 116 for meta data to help with identification of chunks in multi-dimensional erasure code matrices, tape labels, tape serial numbers, user files and erasure code policy related information. In addition to the meta data in partition, a similar but a smaller subset of this data can also reside in a tape CM, the Cartridge Memory. As such, the device 100 can operate to rebuild user data with a collection of one or more tapes only, as self-describing multi-dimensional erasure coded tapes.

Self-describing meta data tapes can enable chunks to be located dynamically, where a meta data self-description partition is able to dynamically update links to chunks in one or more tapes. For example, at least a part of the chunks of a data set could be on the same tape, on the one dimension. The other chunks could be located on the other tapes, as for the second dimension. The metadata can be the data that identifies those chunks that are interleaved across one or more dimensions, which chunks of a file or object are linked with which other chunks and how. This meta data can be able to identify those chunks, know where those chunks are, and which tapes they are located on in order to retrieve those tapes, load them and read those chunks from other tapes (e.g., multiple chunks from each tape), load them and be able to put the data together for reconstruction or restoration of error(s).

To do that identification elements can be used as the metadata stored inside. Typically people write the metadata into separate tapes or into a computer because you want to have fast access to the metadata. If the metadata is with the other data and that is the only thing you have, to retrieve a file you need to go read the tape and get the metadata. Thus, in the case of a disaster or loss of a library storage of tapes any one tape can identify these locations of chunks, which may be interspersed. While metadata can be stored elsewhere (e.g., on a disk, or other copies made), an identification element can be put on each of those chunks to have them self-describing.

The meta data can contain historical values over time as tape or objects are read for either maintenance or actual user demands. This valuable information can be the key to determine how to maintain the data durability by using erasure coded objects where protected objects are wither stored in the same tape or spread across multiple tape or combination of both.

When data is written to tapes currently there is no baseline signature of the quality of written data regardless the data is error correction code protected or replicated by other tapes. Current tape formats do not utilize object or file performance metrics as the original drive is writing the data to the tapes such as defects observed during writing, tracking off track errors encountered, where on the tape the data or objects are written, and were there any retries during write mode. These are typically monitored or measured either after the fact when tapes are analyzed for failures or in laboratory conditions for diagnostic purposes. Once the data is written to tape, there is not necessarily a way to find out exactly how the performance of a given object has performed over time with same or different drives. The decisions to retire the tape is usually done at a tape level when hard errors are encountered which is typically too late requiring copy tapes to be recalled from storage and read to be able to recover the lost section of data or the entire tapes. This is typically a costly and delay prone process that hurts the performance of tape based archival storage.

In most applications especially for the cloud, the system can require high data durability and disaster recovery which means archiving in a distributed manner with multiple sites. The individual tape durability becomes a key requirement even if multiple copies are used. As described above, a small localized error can result in an entire tape having a hard-read error and unless the second copy is error free the backup may fail even with multiple sites. So, ensuring the durability of each tape and providing a cost effective and low latency high availability disaster recovery method with minimum overhead is critical to the success of tape in disaster recovery applications with multiple sites for archival data.

Embodiments herein further include a tape based archival system where user data landing on individual tapes 116 at their originating sites prior to being distributed over multiple sites for geographic dispersion to provide disaster recovery. The tape device/system 100 is configured to achieve a highest disaster recovery and data durability with overheads lower than existing replication based legacy systems.

In an aspect, the device 100 can operate to process, generate, write or read a multi-layer interleaved erasure code policy to provide protection against random or non-random media errors including lost or damaged tapes as well as loss of site or sites during a disaster recovery. The erasure code policy can have global and local parities where the global parities can provide data durability mainly for disaster recovery and local parities with adaptation that provides durability for local per tape media errors. The selection of global and local parity policies by the device 100 results in overheads lower than legacy two copy replication policy while providing data durability nines greater than 3 copy systems; lowest cost at highest data durability. In one embodiment the system does not use replication entirely, yet it can still be a single tape per site application for efficient tape handling.

Adaptation of local parities by the device 100 can be based on a feedback mechanism from the media while the drive is executing read while performing a write process. Detection of questionable media areas (e.g., error, damaged, or like areas of tape) can be detected and only those parities that are affected can be rewritten/restored resulting in uniform data durability nines for per tape application compensating for media magnetic and tracking variations.

Figure 10:
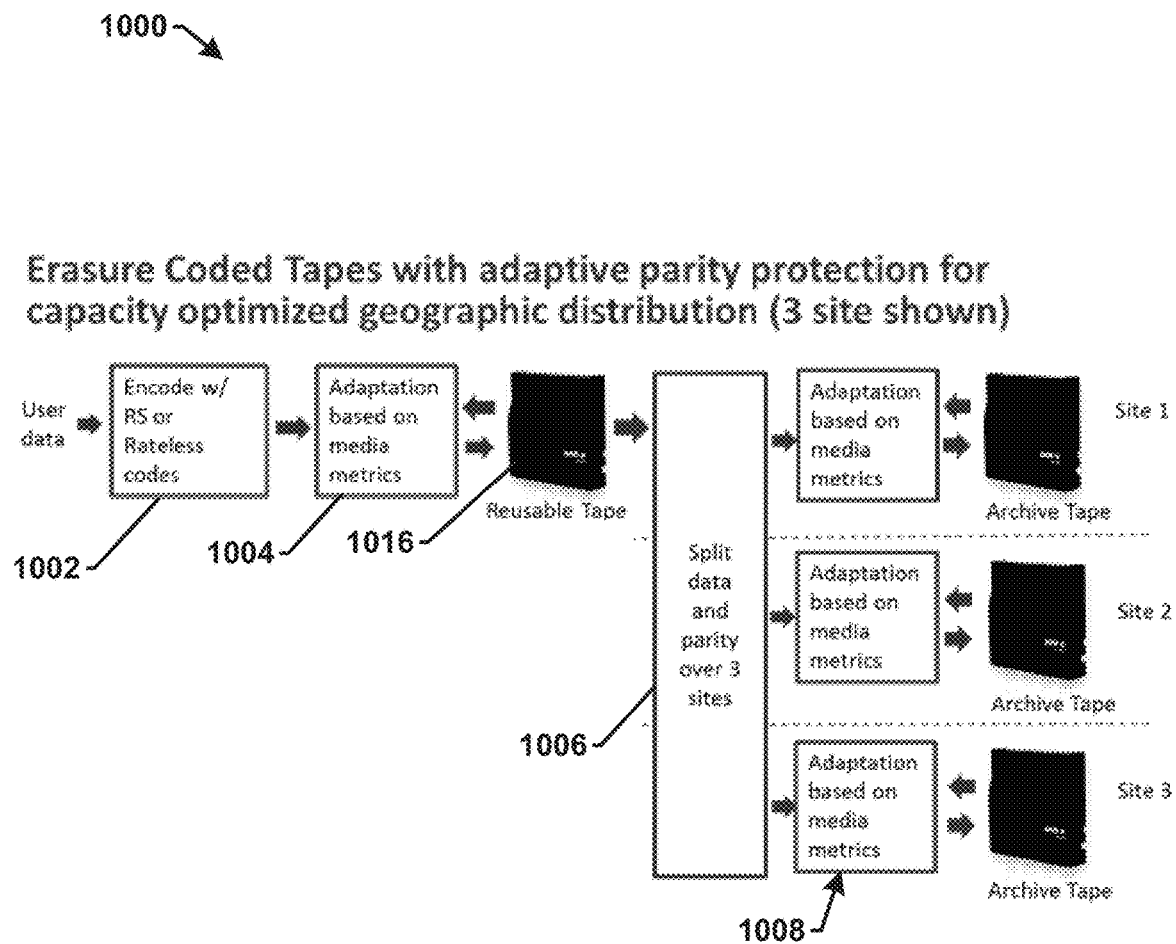
FIG. 10 is an example diagram illustrating an example encoding of tapes with adaptive parity protection for capacity optimized geographic distribution, in connection with various aspects discussed herein.

Referring to FIG. 10, illustrated is an example tape device/system 1000 configured for a 2-layer concept embodiment, with data landing on reusable tape and later distributed over multiple sites (e.g., as libraries or data storage devices as other magnetic tapes off-site for a global dimension or external to another single magnetic tape as the local dimension) with one cartridge per site, which can be implemented for any one or more of the embodiments/aspects described within this disclosure. The system comprises logic components as processing devices/components including an encoding logic component 1002 coupled to an adaptation component 1004 that is coupled to an adaptation component and a reusable tape 1016 (e.g., 116, or the like). A splitting or interspersing/interleaving component 1006 utilizes other adaptation components 1008 that associated the encoded data and parity to corresponding other tapes 1, 2, 3, for example, at one or more other site locations.

Embodiments such as the encoding logic component 1002 can use rateless codes or Reed Solomon (RS) codes. Rateless codes can give a clear advantage since this code can be configured with large amount of parities without costing execution speed and code complexity, for example. The use of these large number of parities enables the policies to have fractional type parity approach, in which different codes or at least a part of chunks can have different policies, for example.

For example, a compatible RS code can have a 54/36 policy which is 1.50 or each site can have exactly 18 symbols and loss of a site can result in 36 symbols remaining, meaning data can be recovered if there is no additional errors otherwise resulting in the loss of user data (e.g., an object, file or parts of data/parity).

In one example, a rateless code can be utilized via the encoding logic component 1002 with a 5700/3600 global parity protection. With the example three sites (1, 2, 3), the original landing tape for a near term archival process can have a 5700/3600 erasure coded data written to the tape(s) plus local adaptive parities demanded by the media. After an amount of time (e.g., weeks, months, years, etc.), each site 1, 2, 3 can have a cartridge with split data and parity from the landing tape or original. Each site can have 1900 symbols out of the 5700 total symbols plus the local parities. The loss of a site or destruction thereof can hypothetically, for example, leave a total of 3800 symbols where the system 1000 can, for example, require a minimum of 3600 symbols to recover user data, meaning recovery can still correct for about 200 media errors on tape.

With RS codes the system 100 can develop a very long code word such that it can now add more parities without costing overhead expense, such as the case with a 5700/3600 code example. Now each side can have 1900 symbols and loss of a site can leave total of 3800 symbols, which are only needed to detect 3600 symbols out of remaining 3800 so there is some extra ones now for potentially using for some new local tape errors. As such, the remainder can be envisioned as being like 3800/3600 RS code.

Embodiments provide herein thus provide an additional layer of protection at a fractional overhead cost but provide a full site protection plus additional errors that might be encountered during rebuild or disaster recovery, a substantial benefit over any existing copy based approaches.

The new overhead based on this example could be 5700/3600 which is 58.333%, but can recover data with an entire site loss plus additional errors. The only existing way to accomplish this performance using replication method is to use 3 copies which can be a costly approach without the benefits of the proposed erasure coded concepts herein.

However, the cost of this version is that data is used from a minimum of 2 out of 3 sites to recover, whereas with 2 copies one can recover from either site with no additional protection. Another variation of the proposal can achieve the same and is not limited to any particular example amount. Once the original data is written to the first tape 1016, a copy can be sent to one of the other sites 1, 2, 3. This can have more overhead but give immediate access to data, yet higher durability than a simple 2 copy system.

In an aspect, erasure coding of tapes can be performed with feedback from the media (e.g., tapes 1016, and tapes 1, 2, 3 at sites 1, 2, 3). Although different kinds of erasure codes such as Reed Solomon, Rateless or LDPC can be used, the examples here are mostly based on rateless codes for illustration since they offer unique fractional type parity with very long code words. RS can be configured to solve the problem with tapes achieving high durability with multi-site disaster recovery applications using minimum storage overhead, minimum cartridges.

Embodiments (e.g., via the splitting or interleaving component 1006, or other tape device component) can combine user files with varying sizes into a fixed size object where this fixed size object is erasure coded to protect with parities. The protected object can be sliced into different chunks of data such that each chunk has only one code word symbol from the protected object codewords.

Once the chunks are formed they are interleaved with other chunks from different objects forming protected records where these records can be written to tape in a sequential order. At each N record, the system via components 1004 and 1008 can collect performance metrics from the drive such as number of rewrites, stop write events and servo error events to determine if the previously written protected records are safe for archival requirements. If the system detects localized errors, the adaptation component(s) can decide to rewrite these records only replicating them along the tape together with the encoding 1002 and interleaving component 1006. If erasure codes that can support adaptation such as rateless are used, the system can add more parities rather than rewriting these records.

As the system writes the protected records and collects performance and identification metrics for each N records where N is minimum 1, via adaptation components 1004, 1008 it can pack the metric data as part of the object meta data file system associating the performance metric meta data per object to be used later on to estimate or predict durability of the protected objects on tape such that written objects can be migrated to new tapes if errors occur such as defect acceleration or degrading tape edge of tape surface issues are detected.

Meta data can include time zero metric data which is captured during the write mode along with tape position information to know exactly where the objects are located on tape mainly for random access usage. As the objects are read for either user request or periodic tape durability sensing, new metrics in the read mode can also be logged as the read mode metric meta data.

Meta data can be written or re-written at a separate index partition for easy and fast access on the tape. Meta data file formatting by the device 1000 can be such that it can be associated with records, codewords, symbols, objects, user files, partial or complete chunks, or the like. Both write mode and read mode metrics (any one of the tape parameters or conditions at the time) can also be formed as part of the meta data. Meta data can also include tape position information so objects can be located with ease. A meta data file can also include other relevant information such as environmental conditions data was written, writing and reading drives.

In write mode control of operation, during writing operation, tape 1016 could be streamed at max speed with minimum or no underruns and retries such that the tape is in an optimal condition during write. Performance and identification metrics meta data collected via one or more adaptation components 1004, 1008 from the drive or head 106 can be used to determine the quality of the written data; this is the feedback part of the proposed embodiments. Especially when erasure coding with multiple tapes are used, the device components or processor 102 can make sure all drives are streamed at a top or maximum defined speed. With per tape EC case, streaming drive at max speed is also important since frequent speed changes due to repositions or underruns can result in tape quality being impacted.

An objective of erasure coded objects/files with performance metrics is to capture a full identification and complete verification of erasure coded objects during writing to tape 1016 or 1, 2, 3 without causing system performance degradation or tape reliability issues. Typically a host sends records to the drive, which internally buffers these to establish its own internal data sets and starts writing these data sets to the tape from its internal buffer or memory 104, for example. A host can get full notification that the records it set to the drive landed on tape when it requests buffer to be flushed. However, this command can result in empty buffer memory, which can force the drive to do an underrun which is not a desirable tape motion since it can cause stagger wraps that may result in degradation of archived media due to possible non-uniform tension profiles.

Figure 11:
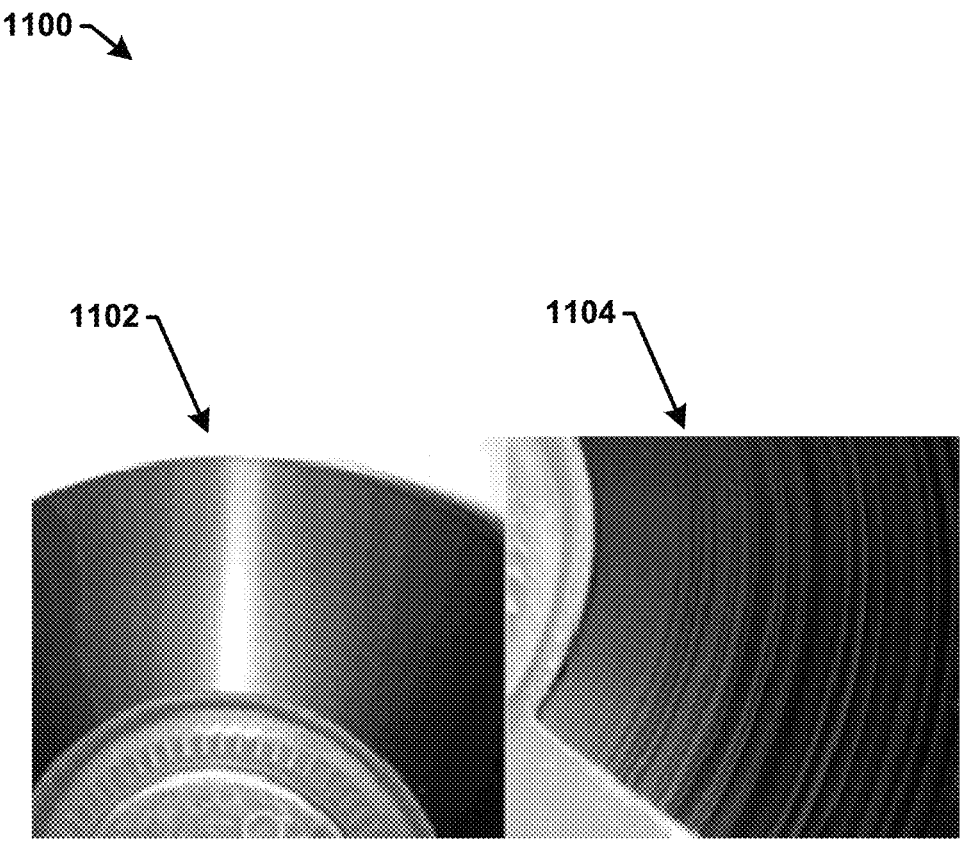
FIG. 11 is an example illustrating on the left a good wind and on the right a poor wind with under runs or back hitches, in connection with various aspects discussed herein.

FIG. 11 is an example of tapes 1100 for a typical underrun result in a tape pack below. The left side is an example of tape 1102 illustrating a good wind and on the right an example of tape 1104 as a poor wind with under runs or back hitches showing.

The process to write erasure coded objects with chunks and records as described above and know its location on tape (as feedback or media metric(s)), can get verification that they were written to tape without flushing the drive buffer and capturing chunk or object performance and reliability metric from the writing (via the adaptation components) where all these data are formed as part of the object/file meta data as the objective goal of writing.

The 5 Key Features of erasure coded objects with self-describing metrics that can include: Location: identification of the Erasure coded objects on tape; Verification: substantiation of objects being written to tape; Tape Handling quality: metrics describing the transfer rate and underruns during the write process; Data Reliability: metrics describing media defect characteristics and the tracking quality for the area of tape where object is written; or Duplication: indication if any or part of the object has been duplicated down the tape to provide further protection as decided by the host software based on detected metrics.

The tape device drive's internal ECC based on tape format such as Linear Tape Open (LTO) Ultrium format can implement its own rewrites as defects are encountered during read after write mode with separate write and read bumps. Detecting rewrites implemented by the drive components after the records are written can give a feedback for the host tape erasure code algorithm to determine if the observed rewrite errors are not random but strongly correlated which can mean that tapes internal ECC may not be strong enough to provide required number of nines if defect acceleration or surface degradation happens down the road as tape ages. The collection of performance metrics as the drive writes the protected records can allow the host device to determine if the records written to tape are free of too many clustered media defects or localized off track events, in which both can be an indication that the tapes 116 internal ECC may not be sufficient to provide the required protection since the tape format ECC is based on randomized (uncorrelated) errors; the localized clustered defects and off track events are non-random (correlated) events therefore may lower the power of tapes own ECC protection. The host device (e.g., 100) can synchronize the performance metric captured from the drive (e.g., processor 102 or head 106) to the actual records written to tape considering the fact that the data is staged in the drives internal buffer (e.g., memory 104 or memory of head 106) before it is physically written to the tape. These synchronization processes can help to correlate the detected performance metrics to the actual records written at that location via one or more adaptation components 1004, 1008. This algorithm can help to establish which protected records to rewrite down the tape. Meta data associated with this rewrite algorithm can also be managed as part of the overall object/file meta data so when reading and decoding the objects from the tape the correct set of records can be built to decode the user data via a decoder component as part of the encoder component 1002 or a separate component (not shown).

Replicating protected records based on the captured performance metric data, which can be part of an overall object or objects, can be a space efficient locally protected system. This protection can come at an expense of tape area reducing the overall native capacity of the tape. However, with the use of erasure codes and replication of suspect records based on performance metric meta data can provide an optimum protection for the user files/objects. This can further eliminate the multiple copies of tapes where written files reply on the tapes internal ECC format only. Therefore, the combination of tapes 1016 or 116 internal ECC format, which can be good for local small errors with external per tape ECC protection with performance metric based record level replication protection, can result in recorded user files to have the highest durability in the presence of random and non-random correlated errors as described herein.

In other embodiments, write mode cache management can be configured. A challenge in writing operations is how to manage the collection and protection of large size objects where the incoming files can be any size (e.g., a min of 4K or above), which can be a typical hard disk drive (HDD) sector size prior to writing on tape. For erasure coding the advantage is to use a large object size where size is optimized for random access performance when reading multiple objects from tape.

Figure 12:
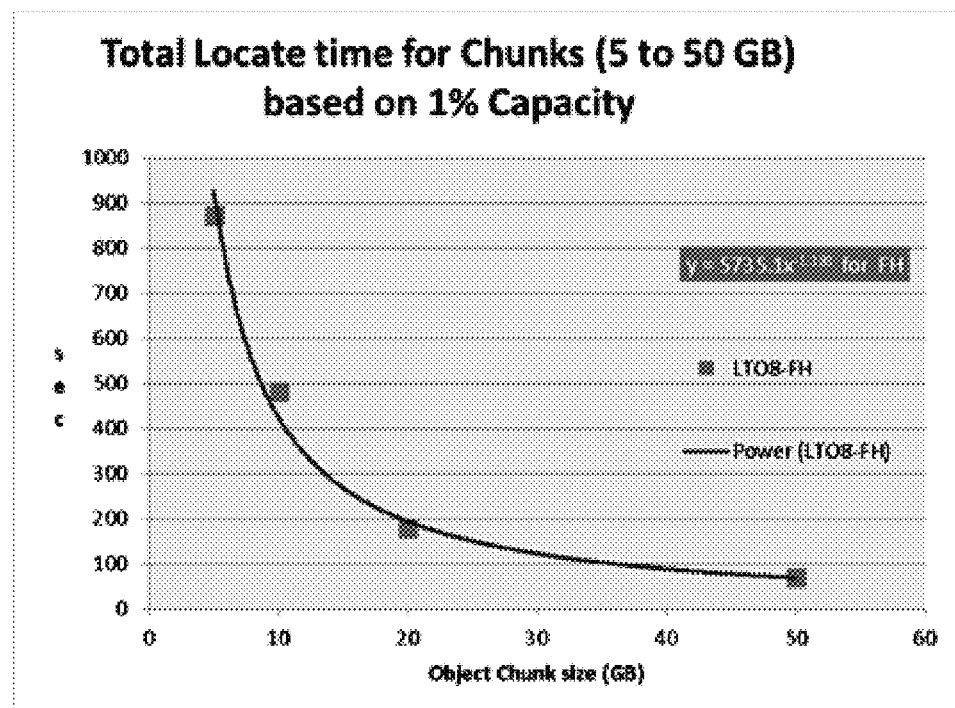
FIG. 12 is an example LTO8 random Object read performance vs. Object size.

Referring to FIG. 12, illustrated is an example random object read performance graph 1200 using reordered reading for LTO8 format. Here, the minimum size with fastest time can be about 20 GB. The task is to build an object size of 20 GB with random files in size and arrival times and keep the object under construction in cache memory that is persistent with a protection policy such as erasure codes or copies of the erasures codes on other tapes until it is eventually written to tape using the described erasure coding herein.

Figure 13:
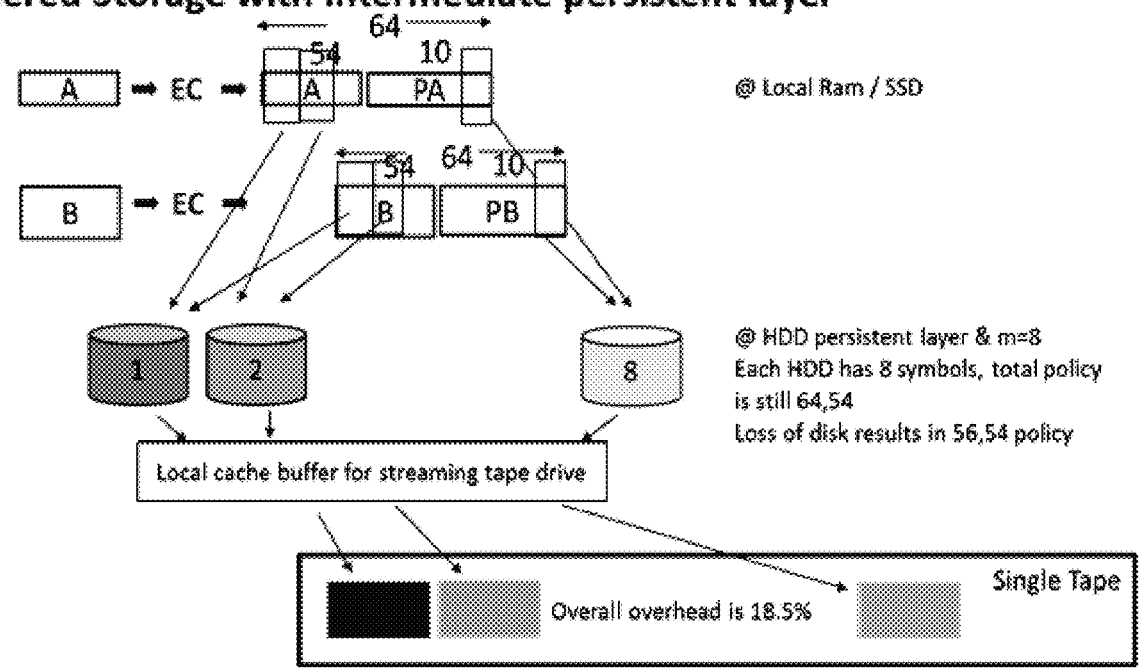
FIG. 13 is an example illustrates tiered storage with an example erasure code policy, in connection with various aspects discussed herein.

Referring to FIG. 13, illustrated is an example of a tiered storage with the erasure code policy 1300 described herein. Embodiments include protecting individual files/objects (e.g., A, B, etc.) while building the final object with one or more tapes and keeping the object under construction protected in a persistent cache memory (e.g., memory 104, local cache buffers 1 thru 8). The erasure code files/objects (data A and parity, data B and parity, etc.) as they come in or are received as data for a tape can be configured with the tape with the final erasure code policy that is designed per tape (as a single tape), but spread over multiple cache devices such that even with the tape based EC policy the distributed files can support the same or higher durability as the final tape stage. Therefore, the object is built as files come in without requiring any special erasure code or replication but based on the final erasure code policy.

The power of per tape ECC with localized replication as described above can be observed as well in the read mode. A typical drive with tape format based ECC can result in hard read errors if the tracking errors or defects result in the uncorrectable error in the tapes C2 ECC, which is the outer layer ECC. As small sections of tape such as a few mm in diameter due to a local defect or an edge damage of about a few mm in length can result in a hard read error resulting in extensive retry mechanism involving repetitive back hitch motions that can further damage the tape surface at the suspect zone of error. With per tape ECC, the drive can be able to skip the suspect zone based one of different aspects.

In a first aspect, (e.g., Method A), the device 100, for example, can abort drive read retry mechanisms/operations and issue the drive/head 106 to skip the bad zone to continue reading data from the remaining tape where per tape ECC and localized (on same tape) replication can collectively decode the missing data. This involves the tape 116 to stop on error, rewind ahead of a bad zone and skip over to the back of the zone to continue reading a next area.

In a second aspect, (e.g., Method B), the device 100, for example, can read on stream (e.g., stream mode) with errors from the tape 116. This can require a new command where tape drive can read with errors or even when no place to put the data in its internal buffer. It can be up to the per tape ECC policy to rebuild the missing data. This method is efficient and good for the tape life, eliminating the tape damaging back hitches.

Also in the read mode, the system can capture the read mode performance metric data mainly the C2 input error rate information for each N record read, N being an integer. This information can be used to determine if the written data quality has changed such that one may have to migrate this object to a new tape. System 100, for example, can update the meta data section with the recently captured read mode performance metric data for the objects read on the single magnetic tape (e.g., 116, 1016).

Referring to FIG. 14, illustrated is an LTO-8 example of interleaved erasure coded objects 1400 and reading over sections of tape with large correlated errors that failed by an internal Tape ECC. FIG. 14 in particular illustrates an example using 4 GB objects encoded using 48/4 policy, 44 data and 4 parity symbols, where 5 objects are interleaved (e.g., via the interleave component 1006) longitudinally along the tape such that over 20 GB of tape space these is only one symbol from each code word. Even if the system fails to read an entire 20 GB tape section, it can still be able to recover the original data since it can decode with 3 remaining parities. This can be done by aborting the drive from doing excessive tape damaging retries and repositioning prior to the error zone, followed by skipping over to the good zone to continue with reading.

Current process if drive firmware does not support the read data with errors are shown below. Note that the distances and values are based on each drive model performance characteristics including tape motion, acceleration and deceleration. The values and numbers indicated can be based on LTO8 drive characteristics, which can include:

detecting host delays in reading and abort read; recording error position (by record number or LPOS number); locating backward 60 meters from the error position (locate backward 60 meters or more to allow high speed search during locate forward); locating forward from current position to the error position+20 meters (skip 20 meters from the error position—ECC must be able to recover min 20 meters missing data); formatting description of EC protected objects on the tape.

Figure 15:
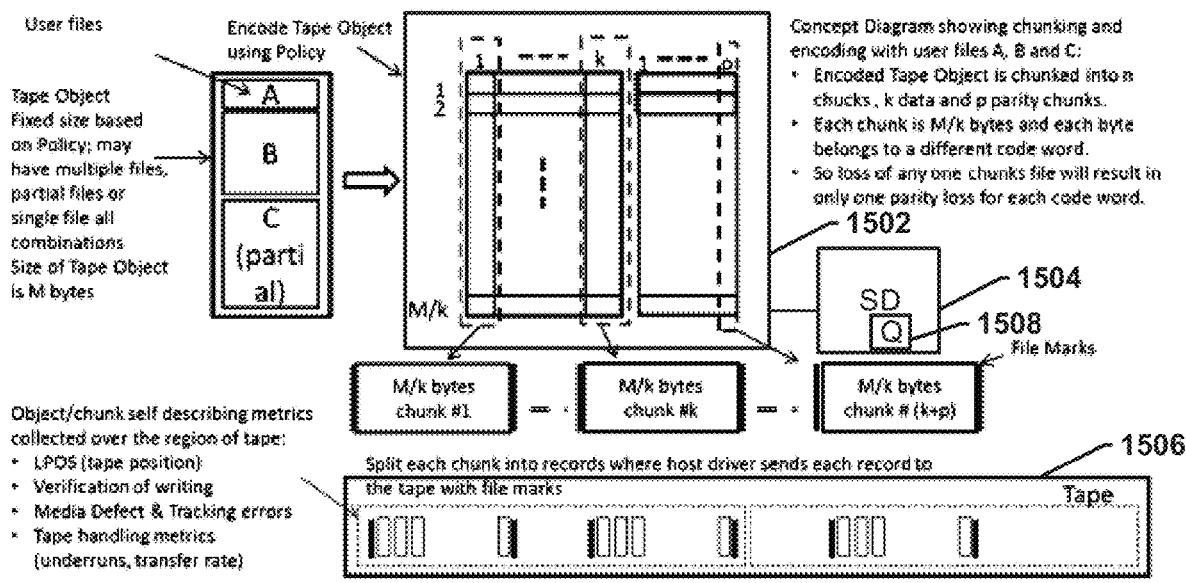
FIG. 15 is an example illustrates tape erasure codes with self-describing metrics, in connection with various aspects discussed herein.

Referring to FIG. 15, illustrated is an example flow chart 1500 for skipping an error zone on tape. The process flow initiates at the top-level architecture of the embodiments described herein. User files (e.g., A, B, C) can be packed into fixed objects where objects can be padded to insure a fixed size. Each object, for example, can be protected by a hash number describing the object itself via a self-describing component 1504 coupled to the encoding/decoding component 1502. Objects can be erasure coded generating code words based on the protection policy via the encoding component 1502. Protected object with code words can be further sliced to generate chunks of data where each chuck has a symbol from each codeword. Chunks are broken into records optimized for a given tape drive based on its format and hardware characteristics. Host driver communicates with drive hardware to send records in a streaming manner via the interleave/distribution component 1506 such that the drive operates at maximum speed without doing stop/start motions or underruns except at the ends of the media for corner turns.

Each N records (typically multiple data points per a given protected object, where N can be a positive integer, e.g., two or more), the host system can request drive to report its performance metrics and tape position to build the self-describing metrics as described in the 5 Key features listed above. Host device (e.g., 100 with one or more components described in this disclosure) can align physically the captured metrics data belonging to N records with the chunks it has already sent to the drive so the 5 Key features list can be assigned to a given set of one or more chunks.

The host device while preparing and sending the next set of chunks, can in parallel analyze the performance metrics for the last chunks associated with the late self-describing metric data. The host device (e.g., 100) can use this to determine if the data written to tape has errors in defects or off tracks that are correlated such that they might jeopardize the durability of the protected user files.

For example, the host device 100 can establish a baseline using previous data (e.g., via the self-describing (SD) component 1504) to determine an average line for defects and off-track events. When the host device detects divergence from this average line, it can decide that even though the written data itself has protection and it is further protected by the drives internal ECC, the durability of data may lack the proper protection, which may be stronger parity assignment compared to the selected one by the host. This is the adaptability of the erasure code by not selecting an overly pessimistic protection policy that compromises tape capacity, but optimizes the protection based on the detected conditions from the tape 116/1016 itself.

Another example, while writing the host device 100 can determine that a last set of chunks related to the last captured self-describing data had too many underruns (e.g., based on a predefined underruns threshold) and transfer rate was lower due to this. The system or device 100 can then decide to rewrite these chunks only not the complete set of chunks making up the full protected object therefore saving capacity, yet optimizing data durability locally based on the detected conditions from the writing process as reported by the drive or head 106.

The combining erasure codes with a feedback from the actual writing to determine if the errors encountered are random or not and the ability to do this while drive is streaming at maximum speed without causing undesirable under runs that can further lower the performance and damage the tape, is the key to this concept and due to the limitations of the hardware processing and memory size, speed and cost of the hardware, not as possible in the past. Recent technological advances in hardware speed, size and cost can allow complex adaptive algorithms such as this one to be feasible.

As above, the tape object can be a fixed size based on a policy, and may have multiple files, as partial files or a single file with all combinations of sizes of a tape object (e.g., as M bytes, M being a positive integer). The encoding component 1502 performs chunking and encoding with user files (e.g., A, B, C, etc.). An encoded tape object can be chunked into n chunks, k data and p parity chunks (e.g., n, k and p being positive integers). Each chunk can be M/k bytes and each byte belonging to a different code word (CW). Thus, loss of any one chunk file can result in only one parity loss for each code word. Object/chunk self-describing metrics collected of a region of tape can include a longitudinal position (LPOS), a verification of writing, media defect and tracking errors at the time, and tape handling metrics (underruns, transfer rate, etc.).

The self-describing component 1504 can include a quality metric component 1508 that configures metadata that identifies an original data quality at a time of writing data on the single magnetic tape, for example. The original data quality (quality at time of write) can include at least one metric of: a defect, a random error, a physical tape position based on a LPOS, or a wrap number defining a lateral position on the single magnetic tape, to establish a reference baseline that enables a detection or a prediction of tape changes over time for a future read or tape scrubbing operation to make a comparison between the reference baseline and another quality metric of the data, for example. A reply back to one or more user devices can also be communicated from the device/system 100 or otherwise herein that data, files, or objects are written to the tapes with erasure coding as the per tape dimension is written to individual tapes where the writing of the parity tapes proceeds during or after the reply back message.

Figure 16:
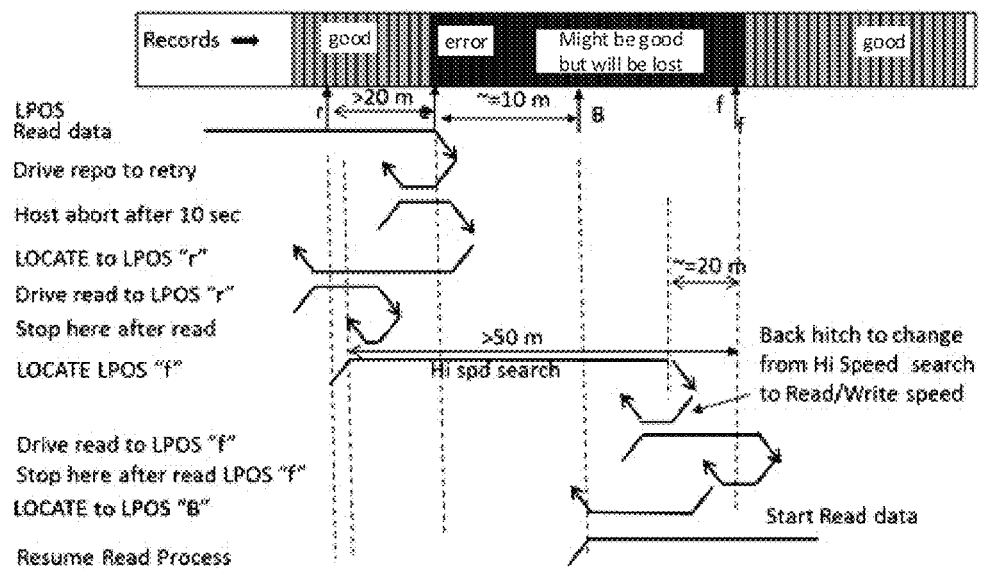
FIG. 16 is an example flow chart for skipping on error zone, in connection with various aspects discussed herein.

Referring to FIG. 16, illustrated is an example flow chart 1600 for skipping on error zone. Minimum data lost based on a process of an LPOS read data, the drive repositions (repo), and the host device aborts after a time period (e.g., about 10 sec, or otherwise). The device can locate to LPOS an marker "r" or other marker, stop here after a read and locate LPOS "f" as another mark point. The drive can read to LPOS "f" and then stop at this location after read LPOS "f", then locate to LPOS "B", another mark point, and resume the read process. This can be an example for skipping error zones with a minimum 10 m tape data lost.

Embodiments herein can further include meta data and tape partitions. Erasure coded Objects based on chunks and records written to tape can enable clear identification information for the read mode, in which this identification can be referred to herein as the meta data. Embodiments of the processing components construct and manage meta data for all objects written on each tape such that random read latency of objects can be minimized and durability not affected by the meta data itself. To read random objects from the tape (e.g., 116, 1016) with minimum latency, the meta data can reside near the BOT in a separate index partition such as LTFS or other types of partitions proprietary in nature where data in the index partition can be rewritten, meaning untrimmed tracks.

Meta data can be space efficient, robust and well protected to ensure that errors encountered on tape can not render objects unreadable. In addition to special a meta data section along the tape, each part or parts of objects could have their individual meta data embedded to their internal data part to provide additional protection for the loss or corruption of the index meta data; system 100/1000, for example, can still recover the full meta data and rebuild it from the individual objects even though possibly a time-consuming task.

Figure 17:
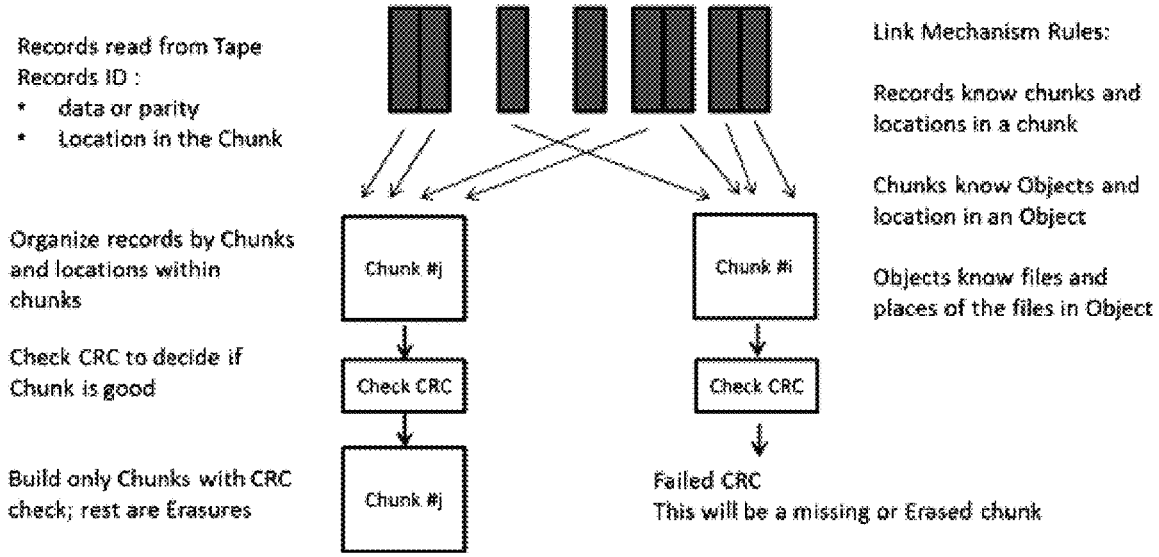
FIG. 17 is an example meta data concept explained in the read mode where objects, chunks, records, data or parity symbols are to be identified, in connection with various aspects discussed herein.

Referring to FIG. 17, illustrated is an example of the meta data 1700 embodiments/aspects herein as explained in the read mode, where objects, chunks, records, data and parity symbols are to be clearly identified. Looking back to FIG. 15, can be seen that there are two different types of chunks for every object, data chunks and parity chunks. This has an advantage when systematic erasure codes are used.

Here, a record or recording of the read from the tape can include records IDs with data or parity, as well as the location of the chunk. The records can be organized by chunks and locations within the chunks of CWs. The next step can include checking cyclic redundancy check (CRC) to determine whether the chunk is in a good condition (e.g., satisfying a metric threshold). The chunks only can be built with the CRC check, and the rest as erasures. A failed CRC can be that the chunk will be missing or erased chunk.

A linking can be configured according to linking mechanism rules. The records can be configured to know chunks and locations in a chunk. Chunks can know or identify the objects and location in an object. Objects can include now files and places of the files in the object, for example.

Referring to FIGS. 18 and 19, illustrated are examples of the erasure coded tape formats including layout and meta data that can be configured with any one or more aspects/embodiments here.

FIG. 18 illustrates an example of a single partition erasure coded tape 1800, for example. The tape 1800 includes a format identification data set (FID), an EC tape ID, a file mark (mark), encoded data sets, another mark for the file, metadata as self-describing, and the end of data (EOD).

For a write from the beginning of tape (BOT): the FID can be written as an LTO format ID, written by the drive FW; a write of the EC tape ID (as EC tape identification); a write of the file mark immediate (as a streaming write); a write encoded data sets (one or more large files); a write of a file mark immediate (as a streaming write); a write of metadata (cartridge information); and at EOD can be written by the drive FW to end of write process.

A write append from EOD can include: a space EOD, a space backward 1 filemark; read a filemark; read and save as old metadata file; write (append/amend encoded data sets; write filemark immediate (as streaming write); append new/ updated metadata into old metadata file; write the metadata file; and establish EOD.

A read operation can include: read EC tape ID by identifying if it is EC tape format; if EC tape, then space EOD; space backward one file mark; read the file mark; read and decode the metadata to find a target reading file for read; locate and read target encoded data sets; and decode the data. Advantages can include utilizing a maximum tape capacity.

FIG. 19 illustrates an example of a two partitions EC tape 1900, for example. The tape 1900 includes two copies of the metadata at different locations along the partitions. The format can include a partition 0 with two wraps as a wrap number that can define a lateral position on the magnetic tape of a partition; and a partition 1 with remaining capacity.

A write from BOT can include: partition 1; a write of FID, EC tape ID, file mark, and meta data; writing encoded data sets (as one or more large files); writing file mark immediate (as a streaming write); writing meta data (cartridge information); writing EOD by drive FW to end of write process; change to Partition 0; writing FID, EC tape ID, file mark, meta data, and EOD.

A write to append from the EOD can include: Partition 0: reading EC tape ID: identify EC tape; Partition 1: Read EC tape ID: identify EC tape; spacing the EOD; space backward one file mark; reading a file mark; read and save as old meta data file; write (append/amend) encoded data sets; write file mark immediate; append/update new meta data into old meta data file; writing the meta data file; EOD; Partition 0: writing FID, EC tape ID, file mark; meta data, and EOD (overwrite meta data).

A read can include: Partition 0: reading EC tape ID: identifying EC tape format; if EC tape, then read and decode meta data; Partition 1: reading EC tape ID: identifying EC tape format; if EC tape, then locate and read a target encoded data sets; and decode data. Advantages in these above processes can include less time to read meta data and having two copies of the meta data.

Other aspects/embodiments that can be utilized via one or more components herein can include verification processes. This is the task of verifying the user files are written on tape (e.g., 116, 1016 or other tapes) with targeted durability including the pre-determined erasure code policy, the use of feedback from media to determine if the written data and parities meet durability requirements (e.g., based on a predefined metric threshold of the one or more metrics described).

Verification of the user data being written on tape can be done by a separate read pass but given the capacities and transfer rates of current and future tapes, this second full pass is not an acceptable process due to excessively long time to read the data. Example current LTO8 with 12 TB and 360 MB/s rates can utilize a minimum time (e.g., 9.25 hours or other time) to write and same amount to read resulting in total of 18.50 hrs, for example, for a write and read cycles separately. Also reading file can only result in an attribute type good or bad indication without knowing where the data durability is between the good and bad zones of a tape.

It is true that the drive with reader and writer bumps do execute a read after a write process but the host system does not know how good the writing was. All the host could possibly know is that the drive did not return a write error. A drive device with dual layer C1 and C2 ECC system utilizes only the inner C1 ECC in the error detect and correct mode to rewrite all uncorrectable errors and does this 100%. The uncorrectable threshold typically can be based on C1 ECC policy. Current drives use Reed Solomon ECC with 249,237,13 meaning the C1 ECC can detect up to and including any 6 errors in a 249 byte codeword and correct all of them, for example. If the errors are larger than 6 bytes this can result in an unrecoverable C1 errors and drive logic can rewrite the entire codeword until its 100% successful. This process can go on for the entire write cycle. What this means is that as long as detected errors are less than equal to 6 bytes these data can be considered good. This process manages both short and long defects that result in greater than 6-byte error per code word, for example. If the errors are random and defects are randomly distributed across the tape (e.g., 116 or others) and they have not grown after the initial writing, the tapes internal protection ECC is very robust as it is specified, less than 1 error in $10^{19}$ user bits, for example. However, during the write, the host is not necessarily aware of how good a given zone on the tape is and if the defects can grow over time or random errors get higher or increase in numbers over time and over use. Therefore, it is assumed that over time and over use, the error rate can stay at the original specified number, 1 error in $10^{19}$ user bits, for example.

Figure 20:
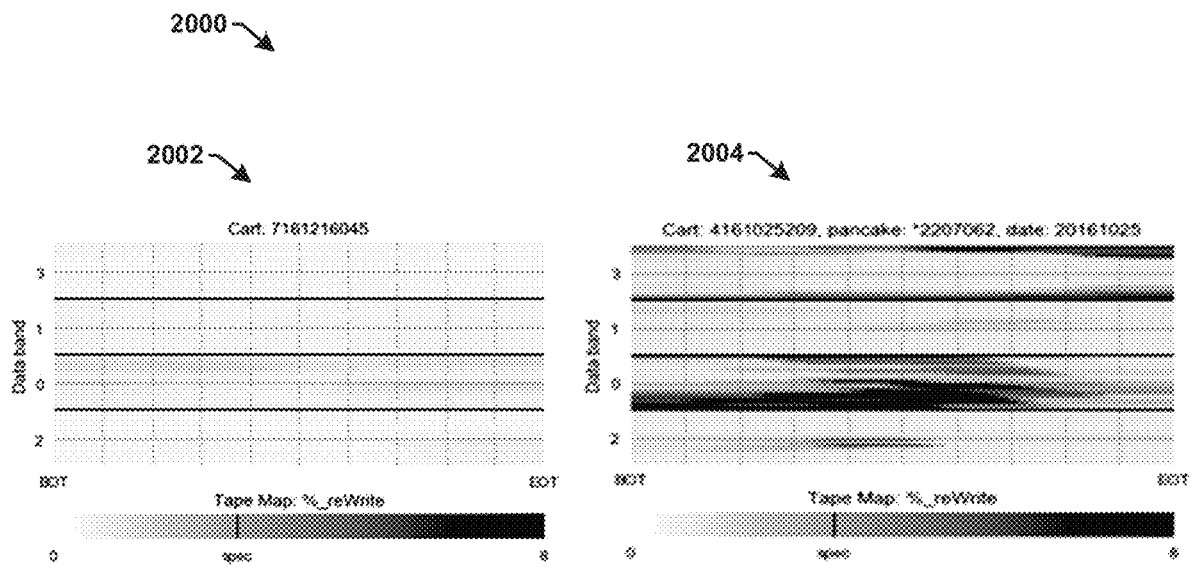
FIG. 20 is example plots of defect characteristics of different tapes, in connection with various aspects discussed herein.

Referring to FIG. 20 See FIG. 12, the two different tapes with defect characteristics are shown where both LTO7 media support 6 TB capacity however from defect point of view they are clearly different and data written to both can most likely have different life characteristics in terms of defect acceleration. As illustrated from plots 2000 at the FIG. 20, the left side 2002 has substantially lower defects compared to right side 2004 media however with typical writing the host can not necessarily be able to know the difference. Also defect acceleration sensitivity can be different for both media. In this embodiment, the host when writing can use additional erasure code but also be able to detect the defect characteristics, which can help to decide if additional protection is needed. Embodiments herein can thus use of replication of the chunks that are affected only.

Another benefit is learning initial defect characteristics at the time of writing, which can later be used to estimate if media quality is changing due to defect acceleration. This metric can be updated at each read or periodically as part of media maintenance procedure, and when and if the host system determines that the data in the deteriorating section is required to be written to another tape, the data migration or repair can be initiated.

Figure 21:
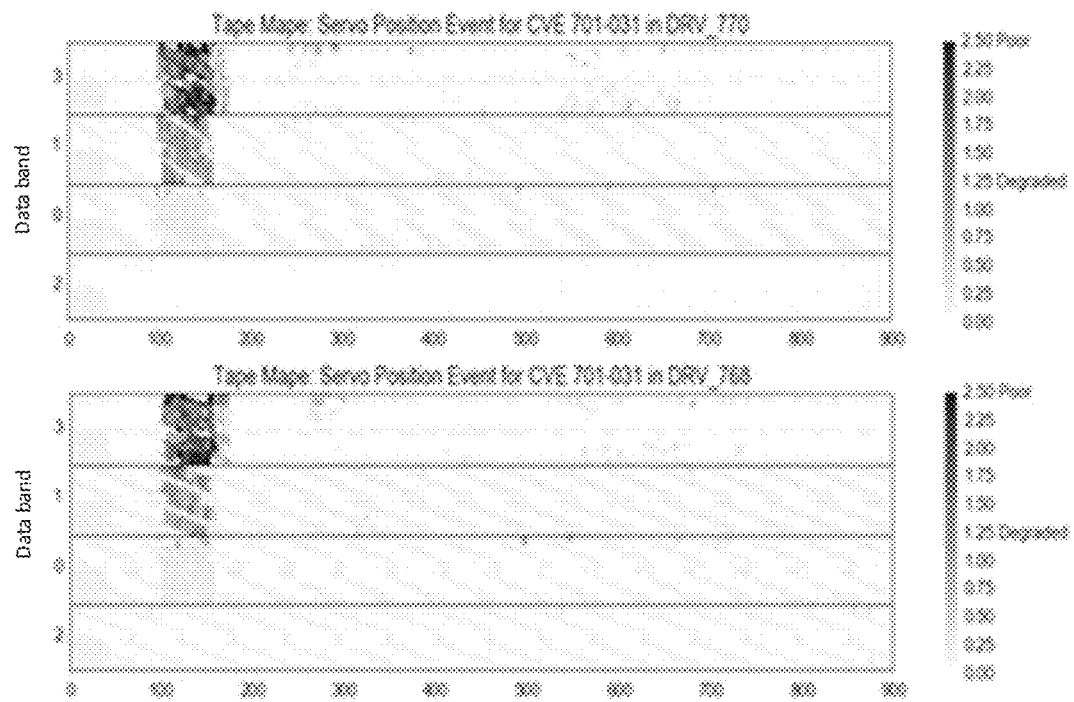
FIG. 21 is an example illustrating where the media has localized off track errors during write, in connection with various aspects discussed herein.

Tracking errors can also be used to determine the quality of the written objects with protection like the use of defect detection metrics as explained above. FIG. 21 illustrates an example where the media 2100 has localized off track errors during write and although the drive was able to write through these error conditions using its internal off-track rewrite algorithm/processes herein, the host cannot necessarily do any decision unless it also is aware of this condition. Embodiments enable the host device to collect off track data during write as explained above and uses this information to determine if additional protection is needed to only the affected chunks. Same as the defect case, tracking error metric data can be used to form a baseline for initial writing where the host can use this information to determine if data migration or repair is needed as the data is read later on or as a result of periodic data integrity check process.

Another benefit of verification is the confirmation that records sent to the drive did land on tape and the area the records landed on media is acceptable defect and off-track characteristics. A host device can request record information landed on the tape each time it requests the self-describing metrics data and align these with the records it sends to the drive device to confirm that the records are written to tape with the tape area quality information, defects and tracking errors.

Other embodiments/aspects that can be used with any one or more components herein can include data migration solution with verified media process(es). The data migration can be a challenging task, especially as tape capacities grow and time to migrate older tapes to newer ones takes too long requiring massive resources that can easily be too costly. Embodiments use media verification process(es) to determine the durability of a cartridge after it is fully written prior to storing for archiving. The system/device herein can collect vital metrics as described above every fixed tape length based on the erasure code chunk size and these metrics can be used to generate tape maps for off track events, C1 error rate, defect maps and other critical metrics that relate to the quality of the media with written data. These maps with data durability information for the entire tape can be part of the meta data that can describe this cartridge for future times when the system needs to determine if there is a change in the characteristics that require migrating only the suspect media. The media testing can be done by sampling the data surface with written data on it to determine if the physical and magnetic characteristics have changed such that the media needs to be migrated. Also with the use of erasure coding and initial verification after the initial full volume writing, the data on the media can have sufficient protection such that future sampling process maybe a very low frequency event.

Other embodiments/aspects that can be used with any one or more components herein can include capacity optimized Geographic Distribution of Erasure Coded Tapes.

For disaster recovery using multiple sites (e.g., 1, 2 3, etc.), the entire data set could need to be recovered in case of a loss of one or more sites. The loss can be physical or temporary, which in the latter case the recovery is needed for high availability since the data at the suspect site is not lost but not necessarily available. The protection for loss of site typically requires replication of data at selected sites. Minimum replication needed to recover for a loss of a single site can be two copies. But, this can mean that the total minimum overhead could be about 100%. This does not consider the fact that each tape may also require to be protected using additional copies at each site since inability to read data from any tape can require the system to find the second copy from one of the other sites, which results in increase in IO traffic and performance loss due to limited 10 bandwidth between the sites. Therefore, combination of per adaptive parity tape erasure codes using feedback from the media and geographic distribution to provide disaster recovery with minimum overhead can be implemental to achieve both highest durability, lowest recovery times with minimum cost including minimum number of tape cartridges.

The basic concept is based on erasure coding tapes and using spreading the chunks from the erasure coded objects to distribute over multiple sites (e.g., sites 1, 2, 3, etc.) where total cartridge can be minimized over basic minimum 2 copy protection system while providing higher durability over the 2-copy policy.

Figure 22:
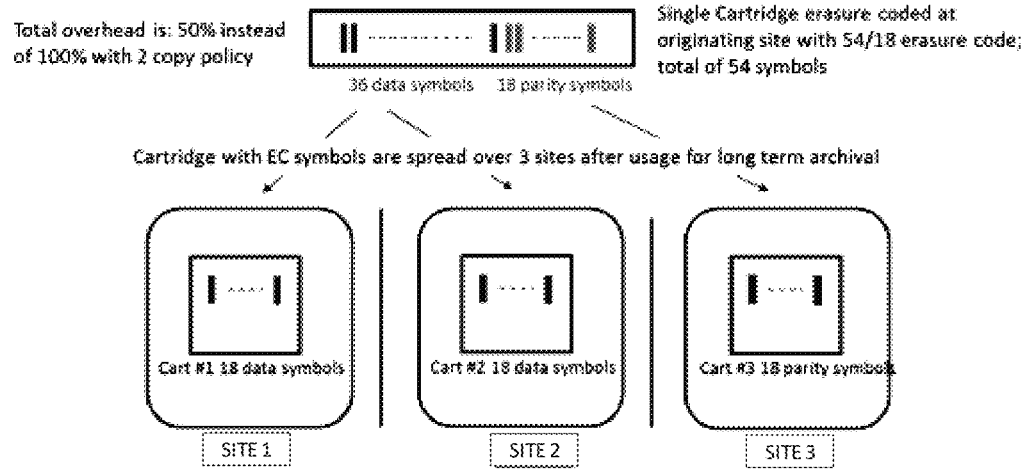
FIG. 22 is an example 3 site geographic archival with one site loss protection, in connection with various aspects discussed herein.

Referring to FIG. 22, illustrated is an example of a 3 site geographic archival with one site loss protection system operation 2200. However, regardless of erasure coding using the small codeword methods such as the one described here, the Reed Solomon, or copy concept, the loss of a site can result in no additional protection with the remaining sites. If one must provide additional protection after a single site loss with 3 sites as shown above, copy based policy can use 3 or more copies and Erasure code can also become the same inefficient in terms of overhead meaning EC policy that can also be 3/1 with no clear advantage. So, with a single site loss for n sites (n being a positive integer), EC based policy can have an overhead advantage but only when single site loss protection otherwise both EC and replication can have the same disadvantage with excessive overhead problem.

For multi-site application with strong protection, meaning even with a loss of a site, the system can still correct for local errors (not additional site loss) without costing overhead problems, the erasure codes could require very long codewords with many parities where the policy can have partial parity count, so the loss of a site can still result in some parities to be maintained at the other sites. This can be feasible with the use of Rateless Codes where code words with very large symbol counts with any numbers can be computed such that with multi-site applications, the problem(s) stated above can be solved without costing storage overheads.

Note that storage overhead can also be a serious problem, especially with the exponential growth of the data. An example can be when a system requires 1 EB storage in future and using 12 TB capacity LTO8 cartridges, data portion could then need 83334 cartridges total, for example. With the 2 copy system operations this can be a total of 166668 cartridges in all 3 sites, for example. Even with the above example with 54/36 erasure code, this could only require 125001; meaning the EC based policy can save 41667 cartridges which is a massive saving. But both systems can be required to rebuild data with no additional parity with a loss of an entire site. This problem can be solved using a rateless code as illustrated in FIG. 23, for example.

Referring to FIG. 23, illustrated is an example of a rateless erasure code-based 3 site protection with fractional parity policy 2300 embodiment. As illustrated, loss of an entire site can result in loss of a total of 1800+100=1900 code word symbols but this still leaves a total of 3600+200=3800 codeword symbols. Therefore, the remaining system can still have additional 200 parities, 100 in each remaining site, to correct for potential localized errors which increases the data durability while maintaining low overhead. The same cannot necessarily be stated for a 2-copy system. A 3-copy can say the same but at a higher cost of an overhead, comparing 200% overhead vs 58.3% overhead.

FIG. 24 illustrates an example optimization process 2400 to determine the ideal erasure code policy for a multi-site disaster recovery as described herein. The example can be given for a 4-site system although the concept can be applied to other combinations as well.

FIG. 24 illustrates Multi Site erasure code selection for a disaster recovery mode, where post disaster the system has additional parities where the overall storage efficiency is maximized by using long code word. The use of Rateless Erasure codes at a slight cost of overhead can be ideal for protecting data stored on tapes for both local site errors as well as entire site loss that provides highest durability without increasing storage overhead.

While the methods or process flows are illustrated and described herein as a series of acts or events, it will be appreciated that the illustrated ordering of such acts or events are not to be interpreted in a limiting sense. For example, some acts can occur in different orders/concurrently with other acts or events apart from those illustrated/described herein. In addition, not all illustrated acts could be required to implement one or more aspects or embodiments of the description herein. Further, one or more of the acts depicted herein may be carried out in one or more separate acts or phases.

Figure 25:
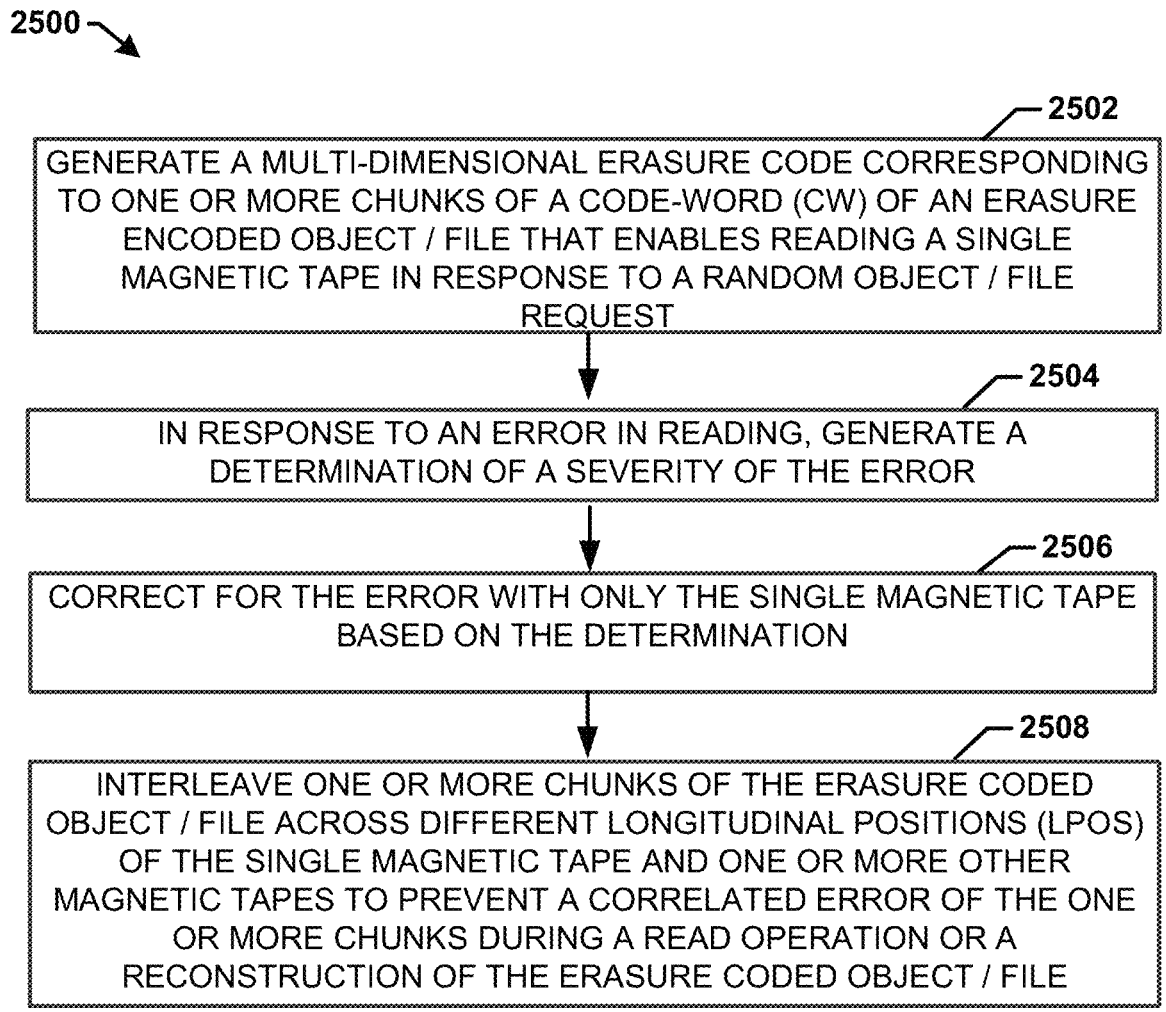
FIG. 25 is an example process flow for tape servo device or system devices to for erasure code storage in accordance with various aspects described.

Referring to FIG. 25, illustrated is an example process flow 2500 for storing data in a data storage system (e.g., magnetic tape system 1000 or otherwise herein). The method 2500 initiates at 2502 with generating a multi-dimensional erasure code corresponding to one or more chunks of a code-word (CW) of an erasure encoded object/file that enables reading a single magnetic tape in response to a random object/file request.

At 2504, the process flow 2500 comprises, in response to an error in reading, generating a determination of a severity of the error (e.g., a severity threshold). The determination, for example, can include determining whether the error satisfies a severity threshold, and in response to satisfying the severity threshold using at least one other magnetic tape with additional parity associated with the erasure encoded object/file and the single magnetic tape to reconstruct data.

At 2506, the process flow 2500 continues with correcting the error with only single magnetic tape based on the determination.

The process flow 2500 can further include at 2508 interleaving one or more chunks of the erasure coded object/file across different longitudinal positions (LPOS) of the single magnetic tape and one or more other magnetic tapes to prevent a correlated error of the one or more chunks during a read operation or a reconstruction of the erasure coded object/file.

In an aspect, the process flow can further include writing to tapes with multi-dimensional orthogonal erasure codes asynchronously where erasure encoded objects/files using a per tape dimension are each written to different magnetic tapes without waiting for others, wherein the writing is a per tape dimension independent of one another, wherein a writing of parity tapes from data tapes using a multiple data tape dimension is performed during or after the writing of the data tapes making the writing process an asynchronous independent process.

The process flow 2500 can further comprise replying back to one or more user devices that at least one of: data, files, or objects are written to the tapes with erasure coding as the per tape dimension is written to individual tapes where the writing of the parity tapes proceeds during or after the reply back.

One of ordinary skill in the art can appreciate that the various non-limiting embodiments of the shared systems and methods described herein can be implemented in connection with any computer or other client or server device, which can be deployed as part of a computer network or in a distributed computing environment, and can be connected to any kind of data store. In this regard, the various non-limiting embodiments described herein can be implemented in any computer system or environment having any number of memory or storage units, and any number of applications and processes occurring across any number of storage units. This includes, but is not limited to, an environment with server computers and client computers deployed in a network environment or a distributed computing environment, having remote or local storage.

Distributed computing provides sharing of computer resources and services by communicative exchange among computing devices and systems. These resources and services include the exchange of information, cache storage and disk storage for objects, such as files. These resources and services also include the sharing of processing power across multiple processing units for load balancing, expansion of resources, specialization of processing, and the like. Distributed computing takes advantage of network connectivity, allowing clients to leverage their collective power to benefit the entire enterprise. In this regard, a variety of devices may have applications, objects or resources that may participate in the shared mechanisms as described for various non-limiting embodiments of the subject disclosure.

Figure 26:
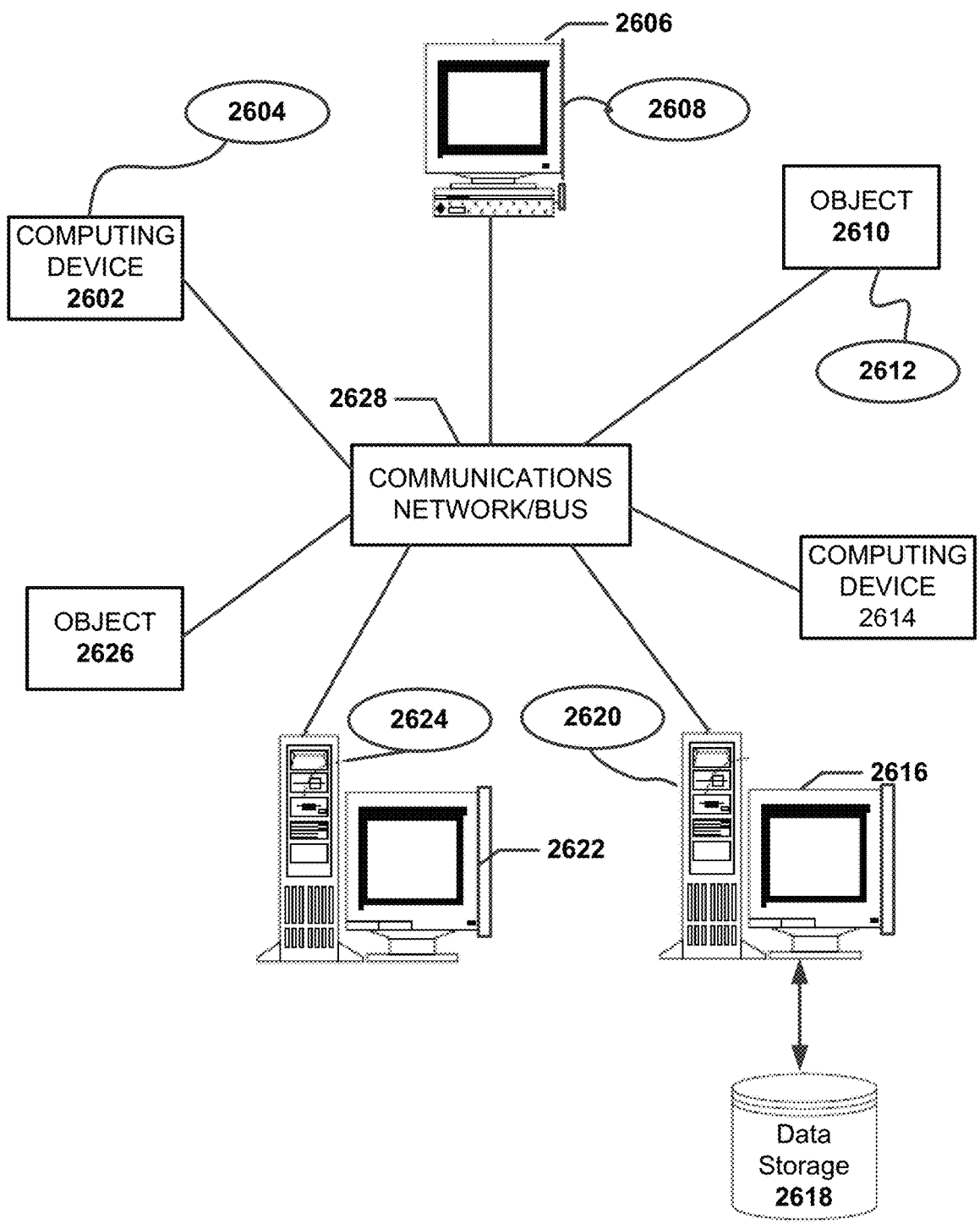
FIG. 26 is a block diagram representing exemplary non-limiting networked environments in which various non-limiting embodiments described herein can be implemented.

FIG. 26 provides a schematic diagram of an exemplary networked or distributed computing environment that can implement one or more components, devices or systems for data band identification for tape servo devices/systems using multiple servo bands as described herein. The distributed computing environment comprises computing objects 2610, 2626, etc. and computing objects or devices 2602, 2606, 2610, 2614, etc., which may include programs, methods, data stores, programmable logic, etc., as represented by applications 2604, 2608, 2612, 2620, 2624. It can be appreciated that computing objects 2612, 2626, etc. and computing objects or devices 2602, 2606, 2610, 2614, etc. may comprise different devices, such as personal digital assistants (PDAs), audio/video devices, mobile phones, MP3 players, personal computers, laptops, etc.

Each computing object 2610, 2612, etc. and computing objects or devices 2620, 2622, 2624, 2626, etc. can communicate with one or more other computing objects 2610, 2612, etc. and computing objects or devices 2620, 2622, 2624, 2626, etc. by way of the communications network 2628, either directly or indirectly. Even though illustrated as a single element in FIG. 26, communications network 2628 may comprise other computing objects and computing devices that provide services to the system of FIG. 26, and/or may represent multiple interconnected networks, which are not shown. Each computing object 2610, 2626, etc. or computing object or device 2620, 2622, 2624, 2626, etc. can also contain an application, such as applications 2604, 2608, 2612, 2620, 2624, that might make use of an API, or other object, software, firmware and/or hardware, suitable for communication with or implementation of the shared shopping systems provided in accordance with various non-limiting embodiments of the subject disclosure.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the shared shopping systems as described in various non-limiting embodiments.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service without having to "know" any working details about the other program or the service itself.

In client/server architecture, particularly a networked system, a client is usually a computer that accesses shared network resources provided by another computer, e.g., a server. In the illustration of FIG. 26, as a non-limiting example, computing objects or devices 2620, 2622, 2624, 2626, etc. can be thought of as clients and computing objects 2610, 2626, etc. can be thought of as servers where computing objects 2610, 2626, etc., acting as servers provide data services, such as receiving data from client computing objects or devices 2620, 2622, 2624, 2626, etc., storing of data, processing of data, transmitting data to client computing objects or devices 2620, 2622, 2624, 2626, 2628, etc., although any computer can be considered a client, a server, or both, depending on the circumstances. Any of these computing devices may be processing data, or requesting services or tasks that may implicate the shared shopping techniques as described herein for one or more non-limiting embodiments.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 2640 or bus is the Internet, for example, the computing objects 2610, 2626, etc. can be Web servers with which other computing objects or devices 2620, 2622, 2624, 2626, etc. communicate via any of a number of known protocols, such as the hypertext transfer protocol (HTTP). Computing objects 2610, 2612, etc. acting as servers may also serve as clients, e.g., computing objects or devices 2620, 2622, 2624, 2626, etc., as may be characteristic of a distributed computing environment.

Figure 27:
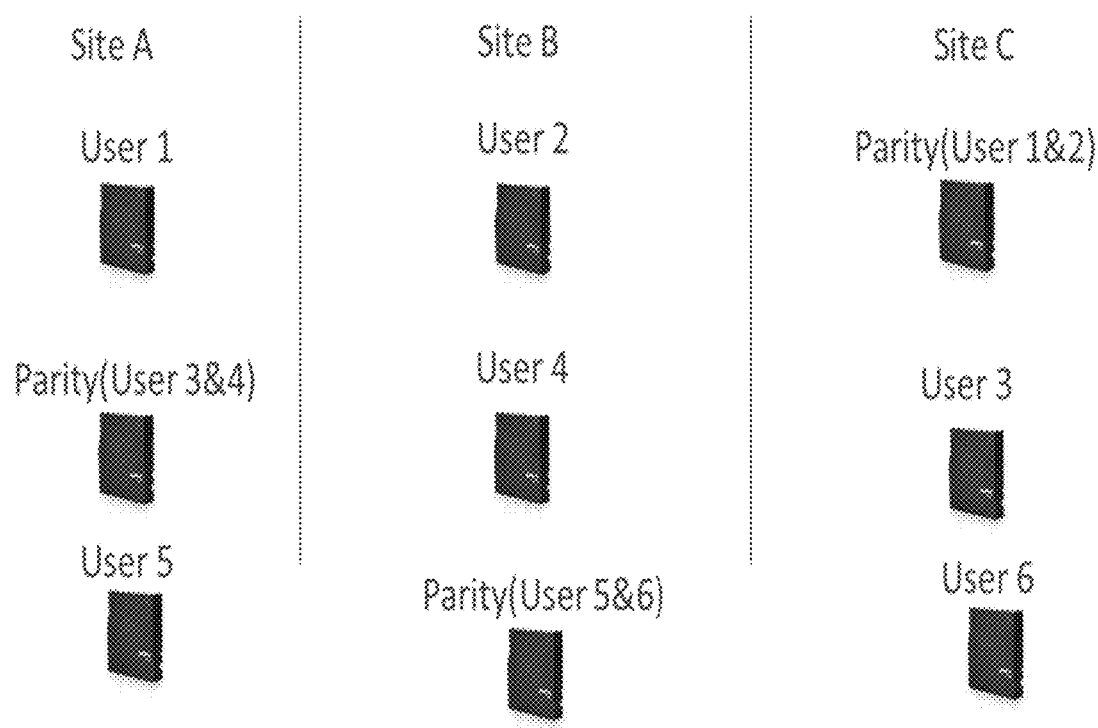
FIG. 27 is another example illustrating multi site erasure code selection for a disaster recovery mode, in connection with various aspects discussed herein.

Referring to FIG. 27, illustrated is another example of a Multi-Dimensional EC with a geographic spread 2700 in accord with various aspects herein.

Here, at least three sites (A, B, C) are being used where data is generated to EC tapes such that data generated in each site is available at that site with local per tape EC protection policy ($1^{st}$ dimension). Also tapes at each sites are globally erasure coded and spread across other sites using the $2^{nd}$ dimension such that loss of a tape at a given site or loss of an entire site can be recovered using the tapes from the other 2 sites resulting in a 3 site geographical spread application with multi-dimensional EC tape(s) architecture where each user when requesting their data their data retrieves it from single tape stored at that site unless the tape is in full or major damage where per tape EC dimension is unable to help recovery.

In an example, a per tape $1^{st}$ dimension EC can use 48/4 policy (44 data plus 4 parity tapes) where each user file is encoded with this EC policy and written to a tape at its originating site. Now a 3/1 policy can be used where 2 data tapes plus a parity tape based on a global EC the $2^{nd}$ dimension. Sites A and B have the data tapes where the Site C has the parity tape.

If the data is generated at site C then a selection can be made from a site A or B to get the $2^{nd}$ data tape so the device can compute the $3^{rd}$ tape that is a parity tape, which can be stored in the remaining $3^{rd}$ site A or B.

This can be done for each data tape so each site has its own data tapes where the data is generated at each site making the recalling data fast using single tape and the site it was generated at. But, when a site is lost this data can be generated from the other 2 remaining sites.

As used herein, the term "circuitry" can refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components or circuits that provide the described functionality. In some embodiments, the circuitry can be implemented in, or functions associated with the circuitry can be implemented by, one or more software or firmware modules. In some embodiments, circuitry can include logic, at least partially operable in hardware.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor can also be implemented as a combination of computing processing units.

In the subject specification, terms such as "store," "data store," data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, non-volatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Other examples of the various aspects/embodiments herein can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations can include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

The following includes definitions of selected terms employed herein. The definitions include various examples and/or forms of components that fall within the scope of a term and that can be used for implementation. The examples are not intended to be limiting. Both singular and plural forms of terms can be within the definitions.

"Computer-readable storage medium" or "computer-readable storage device" as used herein, refers to a non-transitory medium that stores instructions and/or data. "Computer-readable storage medium" or "computer-readable storage device" does not refer to propagated signals, per se. A computer-readable medium can take forms, including, but not limited to, non-volatile media, and volatile media. Non-volatile media can include, for example, optical disks, magnetic disks, and other disks. Volatile media can include, for example, semiconductor memories, dynamic memory, and other memories. Common forms of a computer-readable medium or computer-readable storage device can include, but are not limited to, a floppy disk, a flexible disk, a hard disk, a magnetic tape, a solid state device (SSD) a shingled magnetic recording (SMR) device, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store can be, for example, a database, a table, a file, a data structure (e.g. a list, a queue, a heap, a tree) a memory, a register, or other repository. In different examples, a data store can reside in one logical and/or physical entity and/or can be distributed between two or more logical and/or physical entities.

An "operable connection", or a connection by which entities are "operably connected", is one in which signals, physical communications, or logical communications can be sent or received. An operable connection can include a physical interface, an electrical interface, or a data interface. An operable connection can include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions can be embodied in various forms including routines, algorithms, modules, methods, threads, or programs including separate applications or code from dynamically linked libraries.

"User", as used herein, includes but is not limited to one or more persons, software, logics, applications, processors, circuits, computers or other devices, or combinations of these.

While example methods, apparatus, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. An apparatus for storing erasure encoded data, the apparatus comprising:
    one or more processors coupled to a memory storing executable instructions; and
    an interface that couples the processor, the memory, a plurality of data storage devices and an encoding logic component, wherein the encoding logic component:
        generates or processes a multi-dimensional erasure code on a single magnetic tape in response to a random object/file request, the multi-dimensional erasure code corresponding to erasure encoded objects comprising code-words (CWs),
        generates a determination of whether to utilize the single magnetic tape with a parity or other magnetic tapes to correct for an error within the single magnetic tape, and
        corrects for the error within the single magnetic tape using the single magnetic tape or the other magnetic tapes based on the determination.

2. The apparatus of claim 1, wherein the encoding logic component further generates the multi-dimensional erasure code corresponding to the erasure encoded objects comprising the CWs where a set of dimensions is on each individual tape of the other magnetic tapes and another set of dimensions on the other magnetic tapes where dimensions of the set and the another set of dimensions are orthogonal to one another, and wherein the single magnetic tape and the other magnetic tapes comprise a data set and a parity set, respectively, the parity set derived from the data set.

3. The apparatus of claim 1, wherein the encoding logic component further utilizes data stored on the other magnetic tapes to generate additional parity tapes that recover the error within the single magnetic tape in response to the error satisfying a threshold severity for a reconstruction of the erasure encoded objects or the CWs, wherein the threshold severity comprises completely damaged or lost tapes, wherein the encoding logic component is controlled, at least in part, by one or more iteration coding processes between erasure code dimensions that are orthogonal to one another.

4. The apparatus of claim 1, wherein the encoding logic component is further configured to:
    repair the single magnetic tape from an erasure code dimension comprising the single magnetic tape only without the other magnetic tapes to enable an asynchronous repair process of the single magnetic tape with the error and less resources than further using the other magnetic tapes.

5. The apparatus of claim 1, further comprising:
    an interleave component that interleaves chunks of one or more CWs of one or more different magnetic tapes with one or more chunks of the CWs into a plurality of records, distributes the plurality of records across the plurality of data storage devices as magnetic tapes, and interleaves the one or more chunks of the CWs across the single magnetic tape with at least one of the chunks of the one or more CWs associated with the one or more different magnetic tapes of the plurality of data storage devices.

6. The apparatus of claim 1, wherein the encoding logic component further generates one or more additional parities from one or more chunks of the CWs with corresponding parities and distributes the one or more additional parities to different parity tapes, respectively.

7. The apparatus of claim 1, wherein the encoding logic component further generates the multi-dimensional erasure code across the single magnetic tape and the other magnetic tapes based on a beginning of tape (BOT), end of tape (EOT) awareness allocation that ensures a location of data chunks and parity chunks of the CWs are at different locations at and among the plurality of data storage devices and one or more additional parity tapes to ensure the errors is not correlated at and among both the single magnetic tape and the other magnetic tapes.

8. The apparatus of claim 7, further comprising:
    quality metric component that configures metadata that identifies an original data quality at a time of writing data on the single magnetic tape, wherein the original data quality comprising at least one metric of: a defect, a random error, a physical tape position based on a longitudinal position (LPOS) or a wrap number defining a lateral position on the single magnetic tape, to establish a reference baseline that enables a detection or a prediction of tape changes over time for a future read or tape scrubbing operation to make a comparison between the reference baseline and another quality metric of the data.

9. The apparatus of claim 1, wherein the encoding logic component further generates the multi-dimensional erasure code by interleaving one or more chunks of the CWs within the single magnetic tape, and across the plurality of data storage devices to correlate random errors by ensuring that chunks belonging to a same column codeword are not adjacent or belonging to a same row codeword are not at a similar tape position with respect to a BOT and an EOT location.

10. The apparatus of claim 1, further comprising:
    a self-describing component that identifies chunks across the multi-dimensional erasure code for one or more of: multi-dimensional code matrices, tape labels, tape serial numbers, user files or erasure code policy information among the plurality of data storage devices.

11. The apparatus of claim 1, wherein the encoding logic component further writes or re-writes metadata stored with chunks of the CWs after a repair from an error of at least one of: the single magnetic tape or the other magnetic tapes, to enable linking to at least one updated magnetic tape based on a serial number, bar code, label or other metadata identifier of the chunks, wherein the updated magnetic tape comprises a re-writeable metadata partition.

12. The apparatus of claim 1, further comprising:
a decoding component that upon detecting an error in a tape cartridge or the single magnetic tape, where the error is less than a threshold severity, controlling a tape drive to skip the error without stopping a read operation and to continue reading from the tape cartridge to enable reconstruction of the erasure encoded objects from the single magnetic tape before reconstructing from among the plurality of data storage devices with the other magnetic tapes, wherein the read operation is performed without stopping by a drive of providing data from recovered data sets associated with the erasure encoded objects by at least a partial data set of the recovered data sets, and where a data set is a fixed size of collection of records based on a format of the single magnetic tape constructed from data chunks generated from erasure coding.

13. An apparatus for reading erasure encoded data, the apparatus comprising:
one or more processors coupled to a memory storing executable instructions; and
an interface that couples the processor, the memory, and a plurality of storage devices;
the one or more processors configured to:
read a multi-dimensional erasure code of an erasure encoded object/file with local parity protection by analyzing chunks of a codeword (CW) corresponding to the erasure encoded object/file on a single magnetic tape, determine a severity of an error on the single magnetic tape and whether the severity satisfies a severity threshold, correct for the error on the single magnetic tape based on the multi-dimensional erasure code on the single magnetic tape in response to the severity not satisfying the severity threshold, and correct for the error based on the multi-dimensional erasure code spread across the plurality of storage devices in response to the severity satisfying the severity threshold.

14. The apparatus of claim 13, wherein the one or more processors are further configured to:
control a tape drive to skip the error and continue reading from the single magnetic tape, by stopping, re-positioning on the single magnetic tape or without stopping, in response to the error being less than the severity threshold; and
re-constructing an encoded message or the erasure encoded object/file from the multi-dimensional erasure code of the single magnetic tape.

15. The apparatus of claim 13, wherein the one or more processors are further configured to:
re-build the erasure encoded object/file in response to a random file request or a random object request based on a local erasure on a single magnetic tape code and a global erasure code spread across multiple magnetic tapes on the plurality of storage devices in response to the error satisfying the severity threshold.

16. The apparatus of claim 13, wherein the one or more processors are further configured to:
read the erasure encoded object/file with the local parity protection from the single magnetic tape and from multiple magnetic tapes with different files based on additional parity tapes, wherein a number of magnetic tapes for the CW comprises a number of the plurality of storage devices, the single magnetic tape, and different parity tapes.

17. The apparatus of claim 13, wherein the one or more processors are further configured to:
determine quality metrics of the single magnetic tape at a time of initial writing of the erasure encoded object/file on the single magnetic tape for a reference baseline in a scrubbing process to predict media wear over a period of time.

18. The apparatus of claim 13, wherein the one or more processors are further configured to:
reconstruct the erasure encoded object/file with the local parity protection on the single magnetic tape only; and
in response to the error on the single magnetic tape satisfying the severity threshold, reconstructing the erasure encoded object/file globally from the plurality of storage devices based on one or more iterative decoding processes with orthogonal multi-dimensional forward error correction codes.

19. The apparatus of claim 13, wherein the one or more processors are further configured to:
write data to the single magnetic tape by interspersing at least one chunk of the data with an associated multi-dimensional erasure code across the single magnetic tape with the local parity protection and the plurality of storage devices at different sections of a tape from one another.

20. The apparatus of claim 13, wherein the one or more processors are further configured to:
determine locations of the chunks of the CW corresponding to the erasure encoded object/file based on a set of metadata on the single magnetic tape only, wherein the set of metadata comprises identifiers that enable reading the chunks at the locations comprising the single magnetic tape, at least one other magnetic tape based on a number of n orthogonal dimensions of the multi-dimensional erasure code, an comprising and integer of two or more, or both the single magnetic tape and the at least one other magnetic tape.

21. A non-transitory computer-readable storage medium storing computer executable instructions that when executed by a computer or processing device perform a method for storing data in a data storage system, the method comprising:
generating a multi-dimensional erasure code corresponding to one or more chunks of a code-word (CW) of an erasure encoded object/file that enables reading a single magnetic tape in response to a random object/file request;
in response to an error in reading, generating a determination of a severity of the error, wherein the determination comprises determining whether the error satisfies a severity threshold;
correcting for the error with only the single magnetic tape based on the determination in response to the error not satisfying the severity threshold; and
correcting for the error using at least one other magnetic tape with additional parity associated with the erasure encoded object/file and the single magnetic tape to reconstruct data in response to satisfying the severity threshold.

22. The non-transitory computer-readable storage medium of claim 21, the method further comprising:
interleaving one or more chunks of the erasure encoded object/file across different longitudinal positions (LPOS) of the single magnetic tape and the at least one other magnetic tape to prevent a correlated error of the one or more chunks during a read operation or a reconstruction of the erasure encoded object/file.

23. The non-transitory computer-readable storage medium of claim 21, the method further comprising:

writing to tapes with multi-dimensional orthogonal erasure codes asynchronously where erasure encoded objects/files using a per tape dimension are each written to different magnetic tapes without waiting for others, wherein the writing is a per tape dimension independent of one another, wherein a writing of parity tapes from data tapes using a multiple data tape dimension is performed during or after the writing of the data tapes making the writing an asynchronous independent process.

24. The non-transitory computer-readable storage medium of claim 23, the method further comprising:

replying back to one or more user devices that at least one of: data, files, or objects are written to the tapes with erasure coding as the per tape dimension is written to individual tapes where the writing of the parity tapes proceeds during or after the reply back.

* * * * *